(12) United States Patent
Okuno et al.

(10) Patent No.: US 9,576,603 B2
(45) Date of Patent: Feb. 21, 2017

(54) SUSPENSION BOARD WITH CIRCUIT

(71) Applicant: NITTO DENKO CORPORATION, Osaka (JP)

(72) Inventors: Tomoaki Okuno, Osaka (JP); Yoshito Fujimura, Osaka (JP); Naohiro Terada, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/950,978

(22) Filed: Nov. 24, 2015

(65) Prior Publication Data

US 2016/0234936 A1 Aug. 11, 2016

(30) Foreign Application Priority Data

Nov. 28, 2014 (JP) .................. 2014-240922

(51) Int. Cl.
G11B 21/16 (2006.01)
G11B 5/60 (2006.01)
H05K 1/05 (2006.01)

(52) U.S. Cl.
CPC .................. *G11B 5/60* (2013.01); *H05K 1/056* (2013.01)

(58) Field of Classification Search
CPC ....... G11B 5/4833; G11B 5/486; G11B 21/16; G11B 5/4853; G11B 5/4826; H05K 1/056
See application file for complete search history.

(56) References Cited

U.S. PATENT DOCUMENTS

| 2011/0259632 A1* | 10/2011 | Oosawa | H05K 1/0245 174/266 |
|---|---|---|---|
| 2012/0092794 A1* | 4/2012 | Ohsawa | G11B 5/486 360/246.2 |
| 2012/0162901 A1* | 6/2012 | Miura | G11B 5/484 361/679.33 |
| 2013/0215726 A1 | 8/2013 | Fujimura et al. | |

FOREIGN PATENT DOCUMENTS

JP 2013-200934 A 10/2013

* cited by examiner

*Primary Examiner* — Steven T Sawyer
(74) *Attorney, Agent, or Firm* — Jean C. Edwards, Esq.; Edwards Neils LLC

(57) ABSTRACT

A suspension board with circuit includes a first layer having electrically conductive properties, a second layer having insulation properties and formed at one side in a thickness direction of the first layer, a third layer having electrically conductive properties and formed at one side in the thickness direction of the second layer, and a fourth layer having insulation properties and formed at one side in the thickness direction of the third layer. The first layer includes an electronic component connecting terminal for being electrically connected to an electronic component. The second layer includes a first opening portion passing through in the thickness direction. The third layer includes a first conductive circuit having a magnetic head, and a second conductive circuit. The fourth layer and the second layer are formed with a second opening portion.

7 Claims, 13 Drawing Sheets

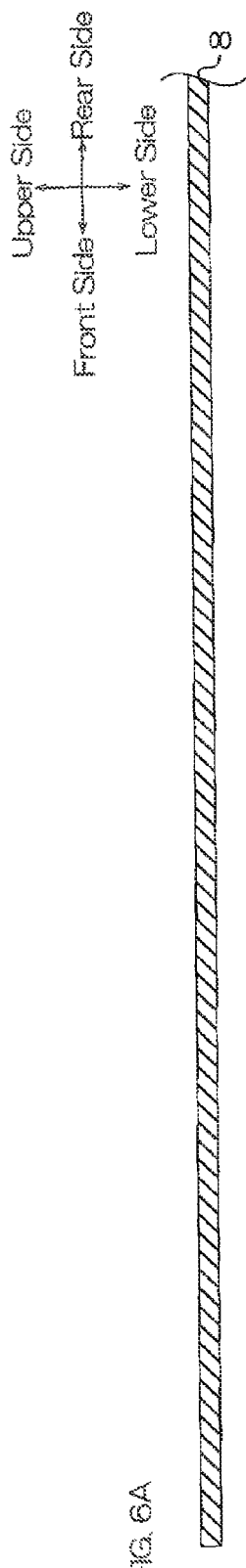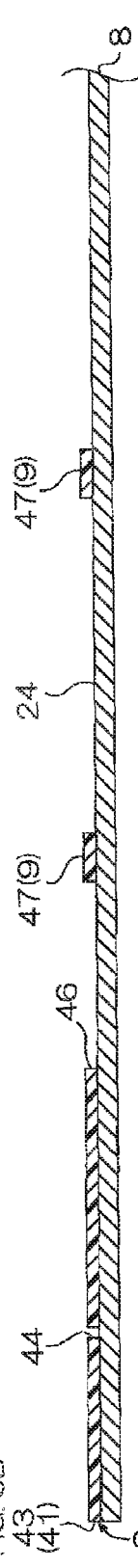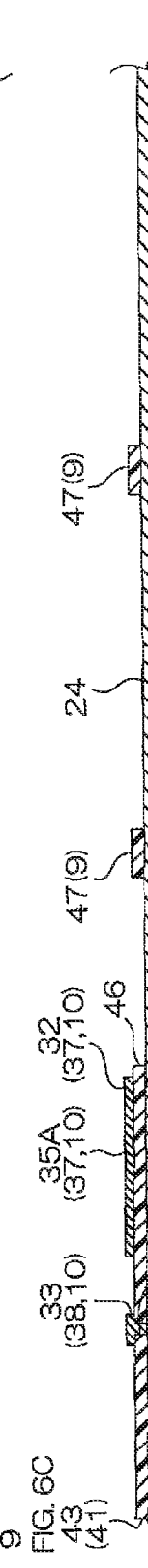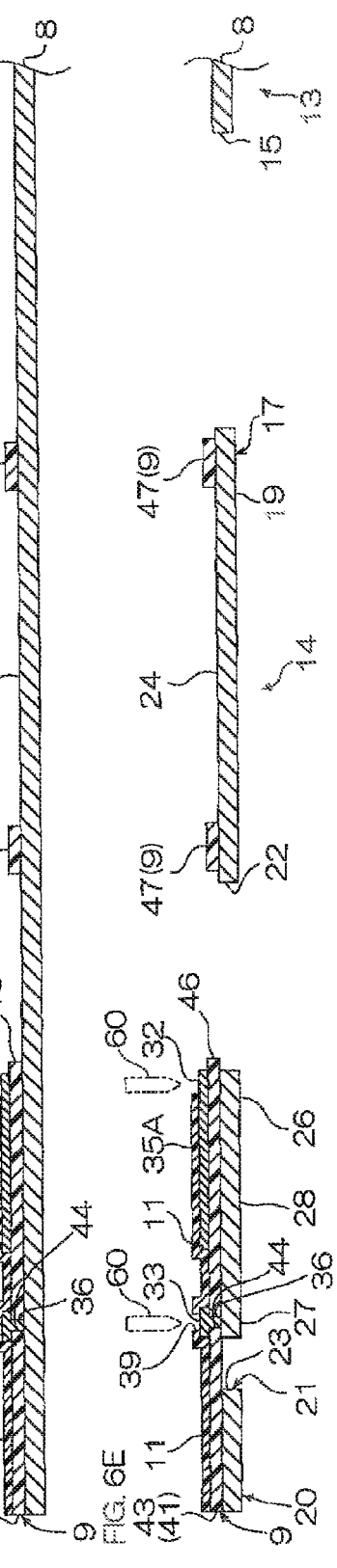

FIG. 9

FIG. 12
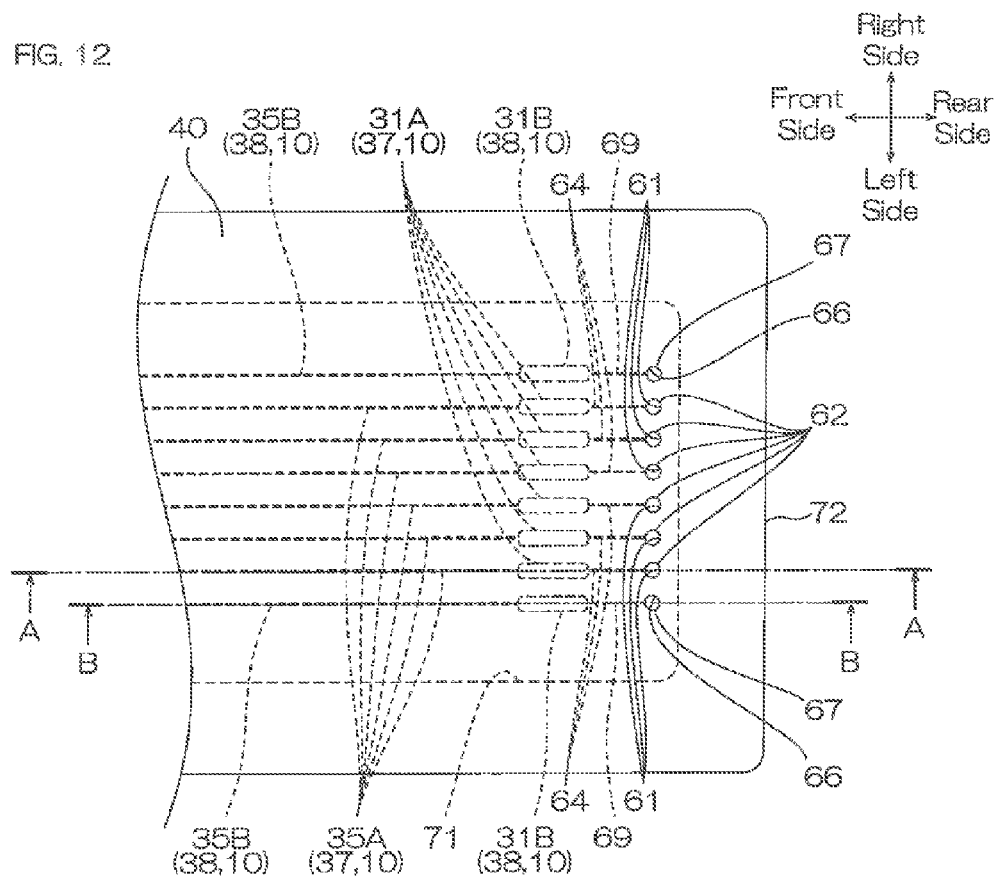
FIG. 13
FIG. 13A
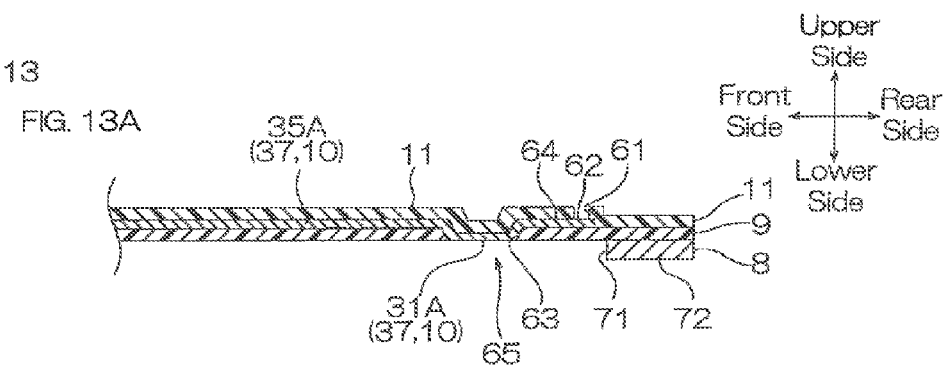
FIG. 13B
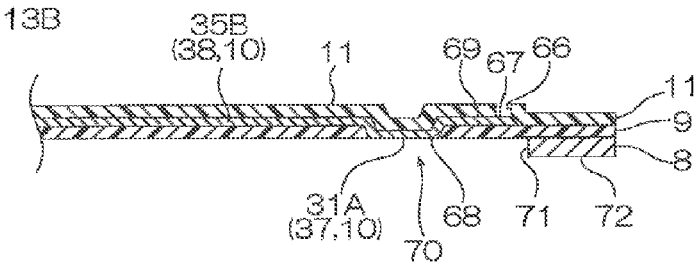

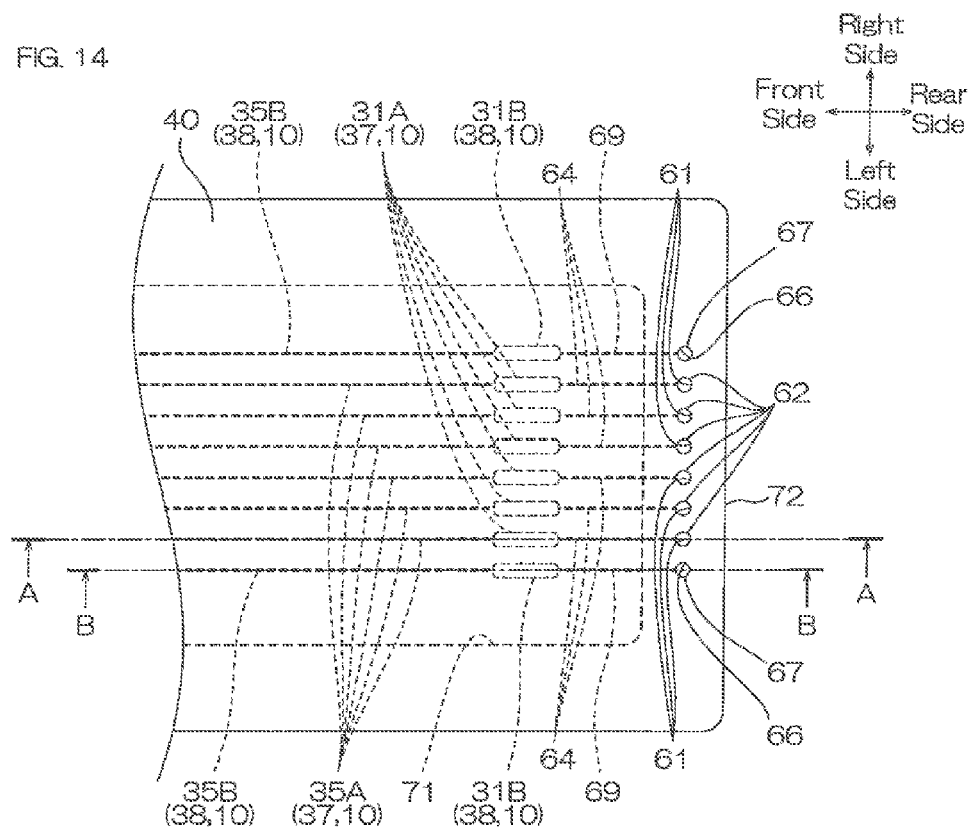
FIG. 14
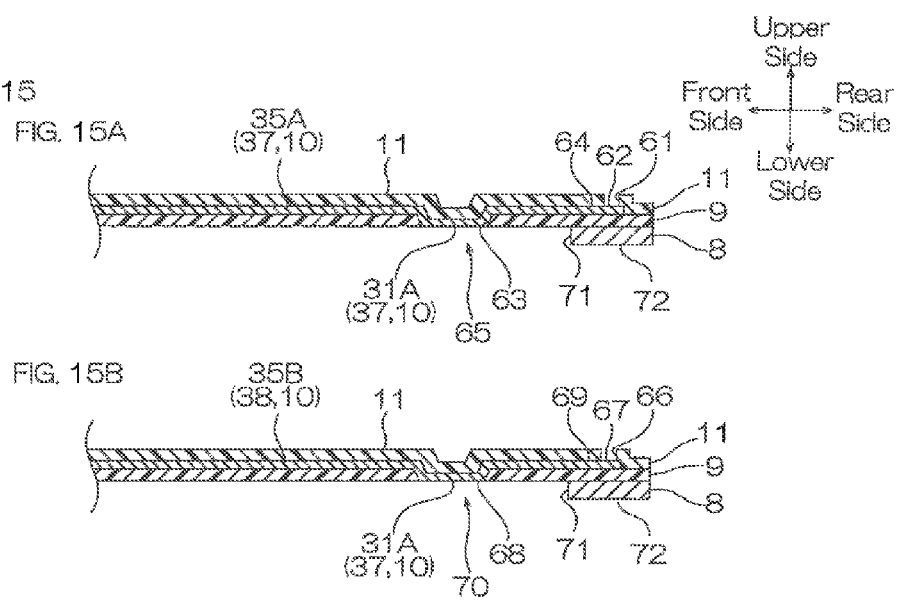
FIG. 15
FIG. 15A
FIG. 15B

SUSPENSION BOARD WITH CIRCUIT

CROSS-REFERENCE TO RELATED APPLICATION

The present application claims priority from Japanese Patent Application No. 2014-240922 filed on Nov. 28, 2014, the contents of which are hereby incorporated by reference into this application.

BACKGROUND OF THE INVENTION

Field of the Invention

The present invention relates to a suspension board with circuit, to be specific, to a suspension board with circuit used in a hard disk drive.

Description of Related Art

As a suspension board with circuit, a suspension board with circuit in which a slider including a magnetic head is provided with respect to a gimbal portion to be mounted on a hard disk drive has been conventionally known.

It has been proposed that an electronic component such as a heat assist device including a laser diode is further mounted in the suspension board with circuit so as to increase the storage capacity of a disk (ref: for example, Japanese Unexamined Patent Publication No. 2013-200934).

SUMMARY OF THE INVENTION

In the suspension board with circuit described in Japanese Unexamined Patent Publication No. 2013-200934, the magnetic head of the slider is configured to be electrically connected to a terminal disposed at one side in a thickness direction of the suspension board with circuit, while the electronic component is configured to be electrically connected to a terminal disposed at the other side in the thickness direction thereof. That is, the above-described suspension board with circuit includes a magnetic head-terminal at the one side in the thickness direction thereof and an electronic component-terminal at the other side in the thickness direction thereof.

In the suspension board with circuit, before the mounting of the slider and the electronic component, an electrical conduction test for a circuit to be connected to each terminal is performed. To be specific, a test probe is pressed against the surface of each of the terminals and electricity is conducted thereto.

The above-described suspension board with circuit, however, includes terminals on both one side (upper side) and the other side (lower side) in the thickness direction, so that it is required that a test probe is pressed against an upper-side terminal (for example, magnetic head-terminal) from the upper side thereof and next, the test probe is moved downwardly to be pressed against a lower-side terminal (for example, electronic component-terminal) from the lower side thereof. As a result, the position setting of the test probe is complicated and the moving distance thereof is increased, so that there is a disadvantage of reduction in working efficiency of the electrical conduction test. That is, in the electrical conduction test of the suspension board with circuit, the test probe is required to be pressed against the surface of the terminal from the side where the surface of the terminal is exposed, so that there is a disadvantage of work limitation on the electrical conduction test.

It is an object of the present invention to provide a suspension board with circuit that is capable of improving the workability of an electrical conduction test.

The present invention [1] includes a suspension board with circuit including a first layer having electrically conductive properties, a second layer having insulation properties and formed at one side in a thickness direction of the first layer, a third layer having electrically conductive properties and formed at one side in the thickness direction of the second layer, and a fourth layer having insulation properties and formed at one side in the thickness direction of the third layer, the first layer including an electronic component connecting terminal for being electrically connected to an electronic component, the second layer including a first opening portion passing through in the thickness direction, the third layer including a first conductive circuit and a second conductive circuit, the first conductive circuit including a magnetic head connecting terminal for being electrically connected to a magnetic head provided in a slider, the first opening portion provided with a connecting portion electrically connecting the second conductive circuit to the first layer, and the fourth layer formed with a second opening portion passing through in the thickness direction and exposing the second conductive circuit or the fourth layer and the second layer formed with a second opening portion passing through in the thickness direction and exposing the first layer.

According to the suspension board with circuit, the magnetic head connecting terminal is provided at the one side in the thickness direction thereof. The second conductive circuit is electrically connected to the first layer including the electronic component connecting terminal via the connecting portion, and at the one side thereof, the second conductive circuit or the first layer is exposed at the inside of the second opening portion.

Thus, by pressing a test probe against the magnetic head connecting terminal and the second conductive circuit or the first layer from the one side in the thickness direction, an electrical conduction test of each of the magnetic head connecting terminal and the electronic component connecting terminal can be performed. Accordingly, improvement in workability of the electrical conduction test can be achieved.

The present invention [2] includes, in the suspension board with circuit described in the above-described [1], at least a part of the second opening portion being overlapped with the connecting portion when projected in the thickness direction.

According to the suspension board with circuit, the electrical conduction test can be performed in the connecting portion that is electrically connected to the first layer, so that the electrical conduction test with higher accuracy can be performed.

The present invention [3] includes, in the suspension board with circuit described in the above-described [1] or [2], the first layer of a metal supporting board, the second layer of a base insulating layer, the third layer of a conductive pattern, and the fourth layer of a cover insulating layer.

According to the suspension board with circuit, the metal supporting board includes the electronic component connecting terminal, so that a further conductive layer for providing the electronic component connecting terminal and an insulating layer for insulating the conductive layer in the thickness direction are not required to be provided. Accordingly, the thinning and light weight of the suspension board with circuit can be achieved.

The present invention [4] further includes, in the suspension board with circuit described in the above-described [1]

or [2], a base insulating layer formed at the other side in the thickness direction of the first layer and a metal supporting board formed at the other side in the thickness direction of the base insulating layer, the first layer of a first conductive pattern, the second layer of an intermediate insulating layer, the third layer of a second conductive pattern, and the fourth layer of a cover insulating layer.

According to the suspension board with circuit, the metal supporting board supports the first layer including the electronic component connecting terminal, so that improvement in mechanical strength of the electronic component connecting terminal can be achieved.

The present invention [5] includes a suspension board with circuit including a first layer having electrically conductive properties, a second layer having insulation properties and formed at one side in a thickness direction of the first layer, a third layer having electrically conductive properties and formed at one side in the thickness direction of the second layer, and a fourth layer having insulation properties and formed at one side in the thickness direction of the third layer, the third layer including a conductive circuit; the conductive circuit including a connecting terminal for being electrically connected to an external component; the first layer and the second layer formed with an other-side opening portion passing through in the thickness direction and exposing the connecting terminal; and the fourth layer formed with a one-side opening portion disposed at a position not being overlapped with the connecting terminal when projected in the thickness direction, passing through in the thickness direction, and exposing the conductive circuit.

According to the suspension board with circuit, the conductive circuit is exposed at the inside of the one-side opening portion at the one side in the thickness direction thereof and the connecting terminal is exposed at the inside of the other-side opening portion at the other side in the thickness direction thereof.

Thus, even in the suspension board with circuit having the connecting terminal exposed at the other side in the thickness direction thereof, by pressing a test probe against the conductive circuit from the one side in the thickness direction, the electrical conduction test can be performed. Accordingly, improvement in workability of the electrical conduction test can be achieved.

According to the suspension board with circuit of the present invention, improvement in workability of the electrical conduction test can be achieved.

BRIEF DESCRIPTION OF THE DRAWINGS

FIGS. 6A to 6E show process drawings for illustrating a method for producing a suspension board with circuit:

FIG. 6A illustrating a step of preparing a metal supporting board,

FIG. 6B illustrating a step of preparing a base insulating layer,

FIG. 6C illustrating a step of forming a conductive pattern,

FIG. 6D illustrating a step of preparing a cover insulating layer, and

FIG. 6E illustrating a step of trimming the metal supporting board.

FIG. 9 shows a sectional view along an A-A line of the gimbal portion shown in FIG. 8.

FIG. 12 shows a plan view (illustrating a cover insulating layer) of a main body portion in a fifth embodiment of a suspension board with circuit of the present invention.

FIGS. 13A and 13B show sectional views of the main body portion shown in FIG. 12:

FIG. 13A illustrating a sectional view along an A-A line and

FIG. 13B illustrating a sectional view along a B-B line.

FIG. 14 shows a plan view (illustrating a cover insulating layer) of a main body portion in a sixth embodiment of a suspension board with circuit of the present invention.

FIGS. 15A and 15B show sectional views of the main body portion shown in FIG. 14:

FIG. 15A illustrating a sectional view along an A-A line and

FIG. 15B illustrating a sectional view along a B-B line.

DETAILED DESCRIPTION OF THE INVENTION

Figure 1:
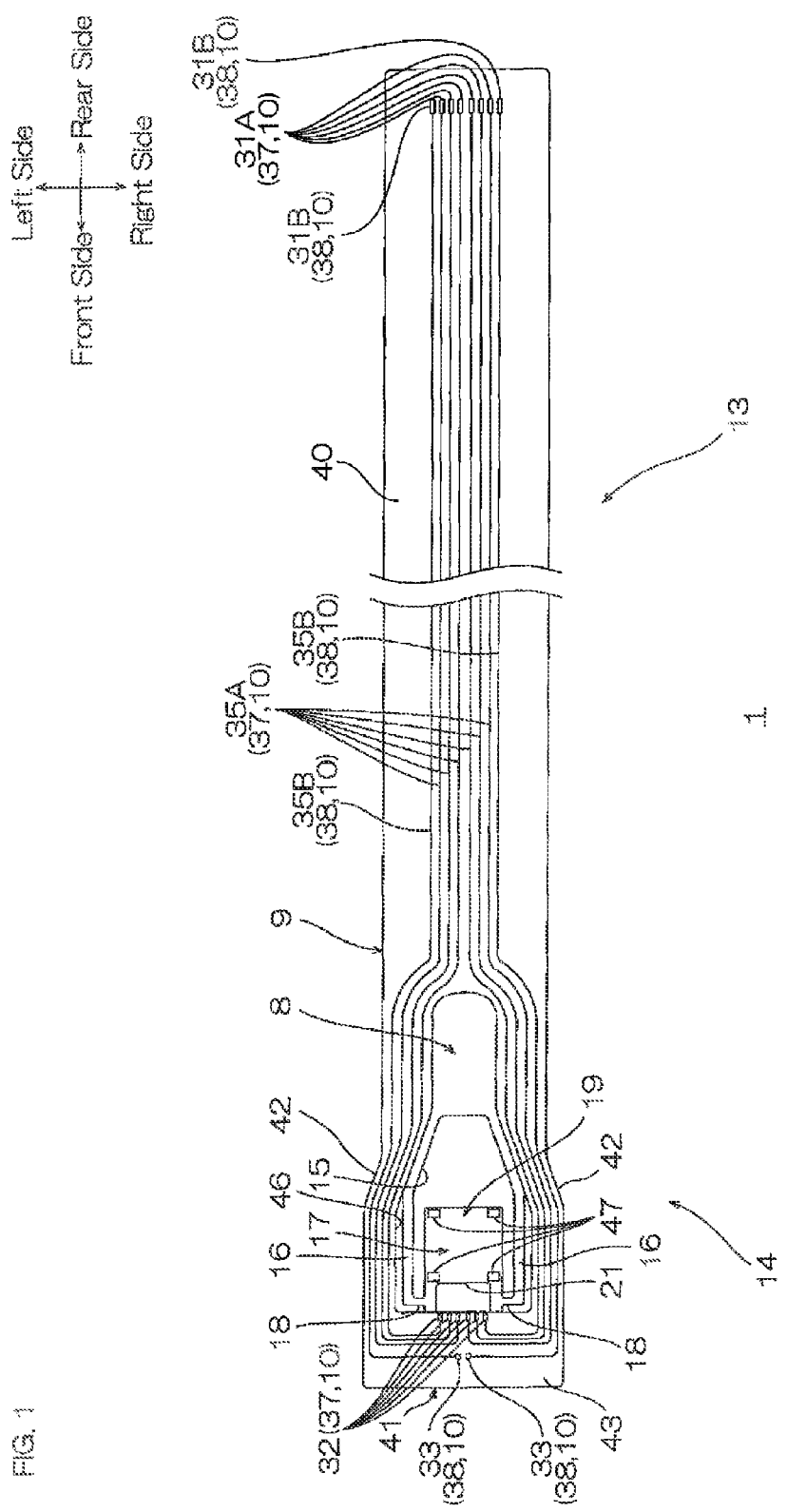
FIG. 1 shows a plan view of a first embodiment of a suspension board with circuit of the present invention.
Figure 2:
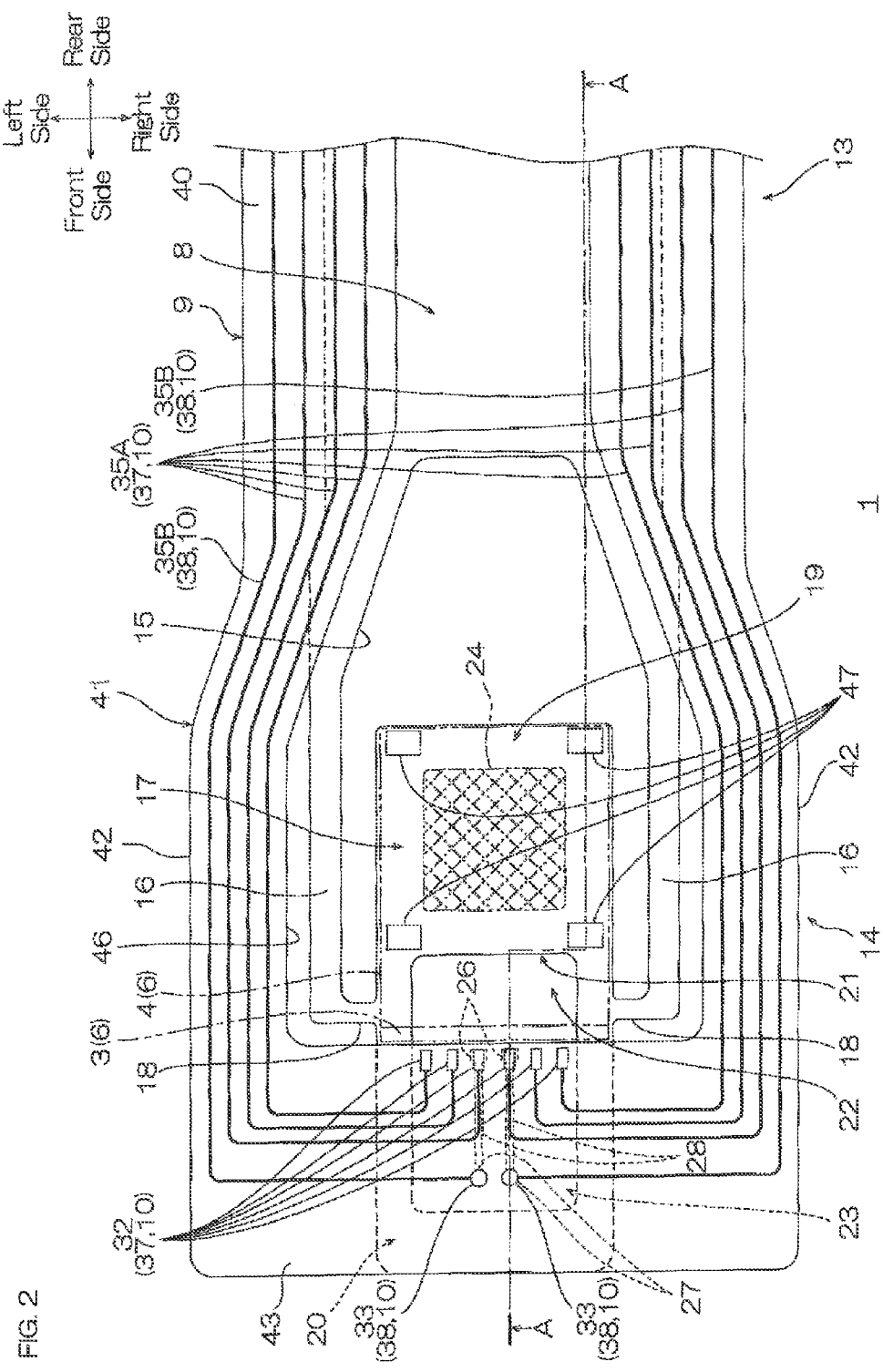
FIG. 2 shows a plan view (omitting a cover insulating layer) of a gimbal portion of the suspension board with circuit shown in FIG. 1.
Figure 3:
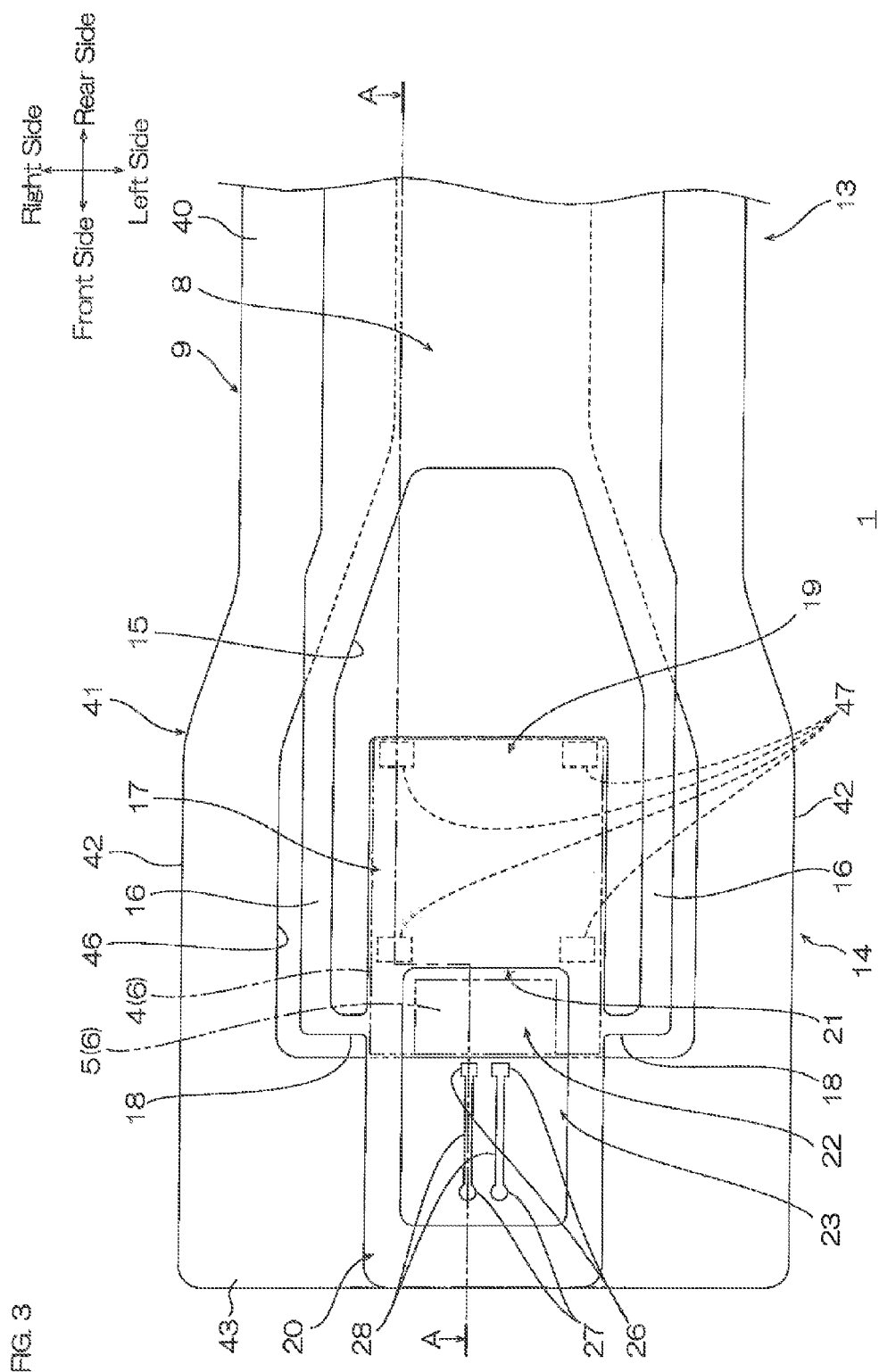
FIG. 3 shows a bottom view of the gimbal portion of the suspension board with circuit shown in FIG. 1.

In FIG. 1, the right-left direction of the paper surface is referred to as a front-rear direction (first direction), the left side of the paper surface is referred to as a front side (one side in the first direction), and the right side of the paper surface is referred to as a rear side (the other side in the first direction). The up-down direction of the paper surface is referred to as a right-left direction (widthwise direction, second direction), the upper side of the paper surface is referred to as a left side (one side in the widthwise direction, one side in the second direction), and the lower side of the paper surface is referred to as a right side (the other side in the widthwise direction, the other side in the second direction). The paper thickness direction of the paper surface is referred to as an up-down direction (thickness direction, third direction), the near side of the paper surface is referred to as an upper side (one side in the thickness direction, one side in the third direction), and the far side of the paper surface is referred to as a lower side (the other side in the thickness direction, the other side in the third direction). To be specific, directions are in conformity with direction arrows in each view. In FIGS. 1 to 3, a cover insulating layer 11 is omitted.

First Embodiment

Figure 4:
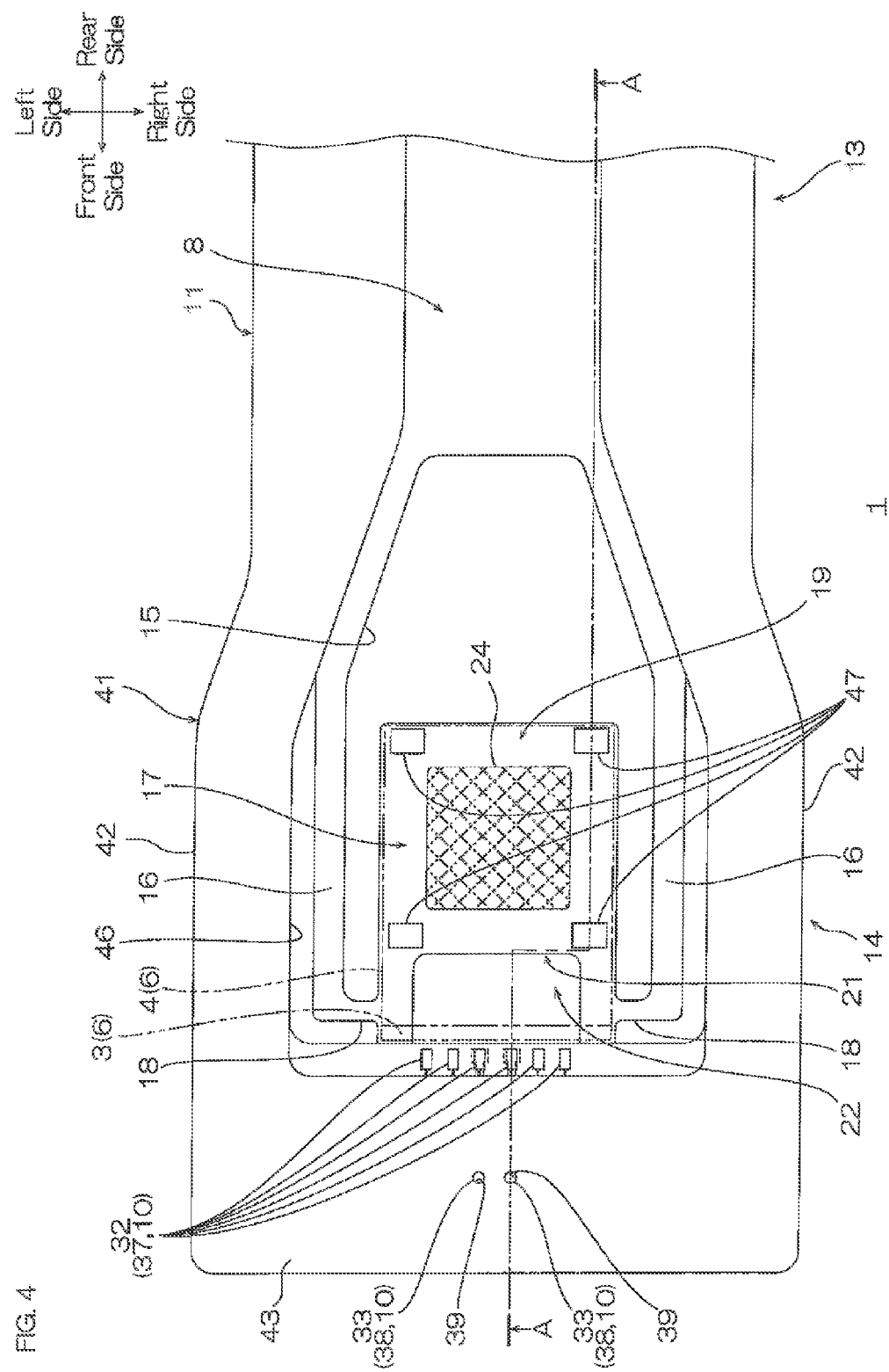
FIG. 4 shows a plan view (illustrating a cover insulating layer) of the gimbal portion of the suspension board with circuit shown in FIG. 1.

As shown in FIG. 4, a suspension board with circuit 1 shown in FIG. 1 is mounted with a slider 4 mounted with a magnetic head 3 and a slider unit 6 mounted with a light emitting element 5 as one example of an electronic component to be then mounted on a hard disk drive (not shown).

Figure 5:
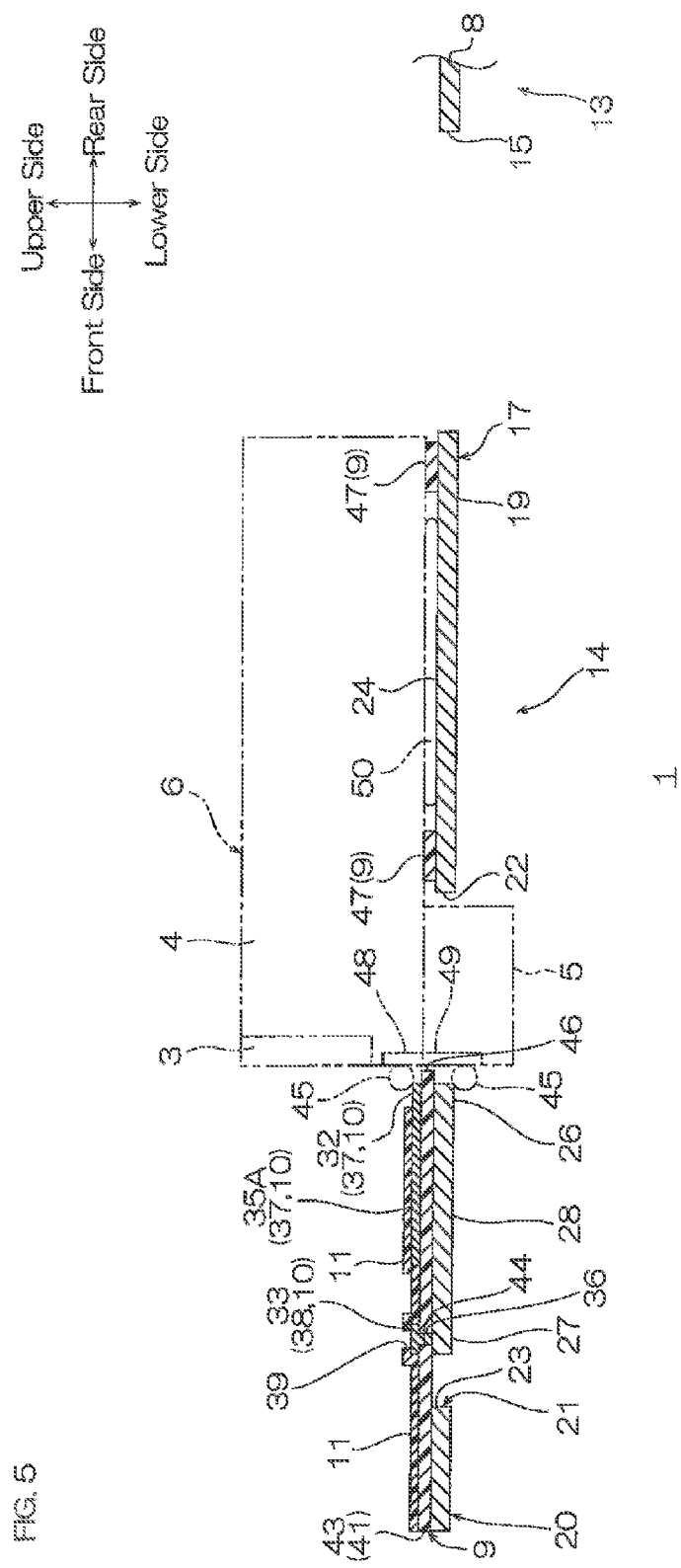
FIG. 5 shows a sectional view along an A-A line of the gimbal portion shown in FIGS. 2 and 3.

As shown in FIG. 1, the suspension board with circuit 1 is formed into a flat belt shape extending in the front-rear direction. As shown in FIG. 5, the suspension board with circuit 1 includes a metal supporting board 8 as one example of a first layer, a base insulating layer 9 that is formed on the metal supporting board 8 as one example of a second layer, a conductive pattern 10 that is formed on the base insulating layer 9 as one example of a third layer, and the cover insulating layer 11 that is formed on the conductive pattern 10 as one example of a fourth layer.

As shown in FIG. 1, the metal supporting board 8 is formed into a flat belt shape extending in the front-rear direction and integrally includes a main body portion 13 and a gimbal portion 14 that is formed at the front side of the main body portion 13.

The main body portion 13 is formed into a generally rectangular shape in plane view extending in the front-rear direction. The main body portion 13 is supported by a load beam (not shown) of the hard disk drive, when the suspension board with circuit 1 is mounted on the hard disk drive.

When the main body portion 13 is mounted on the load beam, the gimbal portion 14 is not mounted on the load beam and the lower surface thereof is exposed from the load beam, and the slider unit 6 (re-phantom lines in FIGS. 2 to 5) is mounted thereon. The gimbal portion 14 is formed so as to extend continuously from the front end of the main body portion 13 forwardly and to be wider than the main body portion 13. The gimbal portion 14 includes one pair of outrigger portions 16, a mounting portion 17, and connecting portions 18 that connect the one pair of outrigger portions 16 to the mounting portion 17.

The outrigger portions 16 are formed into slender rectangular shapes in plane view and are formed as one pair so as to extend in a linear shape from both end portions in the widthwise direction of the main body portion 13 forwardly.

The mounting portion 17 is formed into a generally rectangular shape in plane view that is long in the front-rear direction. The mounting portion 17 is disposed at spaced intervals to the inner sides in the widthwise direction of the one pair of outrigger portions 16 and at spaced intervals in the front-rear direction to the front end edge of the main body portion 13. To be more specific, the mounting portion 17 is disposed so that the rear-side portion thereof is sandwiched between the one pair of outrigger portions 16 and the front-side portion thereof protrudes toward the front side with respect to the front end portions of the outrigger portions 16. In this manner, a rear-side opening portion 15 in a generally U-shape having an opening forwardly in plane view is formed between the mounting portion 17 and the one pair of outrigger portions 16, and between the mounting portion 17 and the main body portion 13.

The connecting portions 18 extend in the widthwise direction so as to connect the front end portions of the one pair of outrigger portions 16 to both ends in the widthwise direction at the center in the front-rear direction of the mounting portion 17. That is, the one pair of connecting portions 18 are connected to the mounting portion 17 at the generally center in the front-rear direction of the mounting portion 17.

In the mounting portion 17, with a slightly front side (to be specific, the rear end edge of a gimbal front end insulating layer 43 to be described later) with respect to the connecting portions 18 as a reference, the rear side with respect to the reference is defined as a slider mounting portion 19 and the front side with respect to the reference is defined as a terminal mounting portion 20.

In the mounting portion 17, a front-side opening portion 21 is formed from the generally center in the front-rear direction over the front-side portion at the center in the widthwise direction of the mounting portion 17.

The front-side opening portion 21 is formed into a generally rectangular shape in plane view so as to pass through the metal supporting board 8 in the thickness direction.

As shown in FIG. 3, in the mounting portion 17, the front-side opening portion 21 in the slider mounting portion 19, that is, the rear-side portion of the front-side opening portion 21 is defined as a light emitting element insertion region 22, and the front-side opening portion 21 in the terminal mounting portion 20, that is, the front-side portion and the central portion in the front-rear direction of the front-side opening portion 21 are defined as a terminal forming region 23.

The slider mounting portion 19 is a slider mounting region on which the slider unit 6 is mounted. In the slider mounting portion 19, an adhesive region 24 to which an adhesive 50 (described later) for disposing the slider unit 6 is applied is defined at the generally center in plane view in the rear-side portion with respect to the light emitting element insertion region 22.

The terminal mounting portion 20 includes metal supporting terminals 26 as one example of an electronic component connecting terminal, metal-side connecting terminals 27, and metal wires 28 at the inside of the terminal forming region 23.

The metal supporting terminals 26 are provided at the rear-side portion of the terminal forming region 23 and are formed into generally rectangular shapes (square land shapes) in plane view. A plurality (two pieces) of metal supporting terminals 26 are disposed at spaced intervals to each other in the widthwise direction.

The metal-side connecting terminals 27 are provided at the front sides of the metal supporting terminals 26 and at the front-side portion of the terminal forming region 23, and are formed into generally circular shapes (round land shapes) in bottom view. A plurality (two pieces) of metal-side connecting terminals 27 are disposed at spaced intervals to each other in the widthwise direction.

The metal wires 28 are formed to extend in the front-rear direction so as to electrically connect the metal supporting terminals 26 to the metal-side connecting terminals 27. A plurality (two pieces) of metal wires 28 are disposed at spaced intervals to each other in the widthwise direction.

The metal supporting board 8 is, for example, formed of a metal material such as stainless steel, 42-alloy, aluminum, copper-beryllium, and phosphor bronze. Preferably, the metal supporting board 8 is formed of stainless steel.

The metal supporting board 8 has a thickness of, for example, 5 μm or more, or preferably 10 μm or more, and, for example, 30 μm or less, or preferably 25 μm or less.

The metal wire 28 has a width of, for example, 5 μm or more, or preferably 10 μm or more, and, for example, 100 μm or less, or preferably 90 μm or less.

A gap between the plurality of metal wires 28 is, for example, 5 μm or more, or preferably 10 μm or more, and, for example, 100 μm or less, or preferably 90 μm or less.

The metal supporting terminal 26 and the metal-side connecting terminal 27 have a width and a length (length in the front-rear direction) of, for example, 5 μm or more, or preferably 10 μm or more, and, for example, 500 μm or less, or preferably 450 μm or less.

As referred to FIGS. 1 and 5, the base insulating layer 9 is formed on the upper surface of the metal supporting board 8. To be specific, the base insulating layer 9 includes a main body portion insulating layer 40 corresponding to the main body portion 13 and a gimbal portion insulating layer 41 corresponding to the gimbal portion 14.

The main body portion insulating layer 40 is formed into a generally Y-shape in plane view extending from the rear end portion forwardly and branching off toward obliquely both outer front sides in the widthwise direction in the front end portion of the main body portion 13 on the upper surface of the main body portion 13 so as to correspond to a pattern in which the conductive pattern 10 is formed As shown in FIG. 2, the gimbal portion insulating layer 41 includes one pair of gimbal outer-side insulating layers 42 that extend continuously from the front end portion of the main body portion insulating layer 40 toward the front side at spaced intervals to each other in the widthwise direction and a gimbal front end insulating layer 43 that connects the front end portions of the one pair of gimbal outer-side insulating layers 42.

The one pair of gimbal outer-side insulating layers 42 are formed into generally rectangular shapes in plane view bending and extending forwardly at the outer side in the widthwise direction with respect to the gimbal portion 14 after extending continuously from the front end portions of the branching main body portion insulating layer 40 toward obliquely both outer front sides in the widthwise direction.

The gimbal front end insulating layer 43 is formed into a generally rectangular shape in plane view extending in the widthwise direction so as to be disposed between the front end portions of the one pair of gimbal outer-side insulating layers 42. The front end edge of the gimbal front end insulating layer 43 matches that of the mounting portion 17 of the metal supporting board 8. The gimbal front end insulating layer 43 is disposed so as to traverse the terminal mounting portion 20 in the widthwise direction. In other words, in the mounting portion 17, when projected in the thickness direction, a portion overlapped with the gimbal front end insulating layer 43 is the terminal mounting portion 20 and a portion not overlapped with the gimbal front end insulating layer 43 is the slider mounting portion 19.

As shown in FIG. 5, a plurality (two pieces) of communicating holes 44 as one example of a first opening portion are formed in the gimbal front end insulating layer 43.

The communicating holes 44 are, when projected in the thickness direction, formed into generally circular shapes in plane view so as to pass through the gimbal front end insulating layer 43 in the thickness direction in portions overlapped with the metal-side connecting terminals 27.

As shown in FIG. 2, a gimbal opening portion 46 is defined in the gimbal portion insulating layer 41 by the one pair of gimbal outer-side insulating layers 42 and the gimbal front end insulating layer 43. That is, the gimbal opening portion 46 is an opening in a generally rectangular shape in plane view. The rear-side opening portion 15, the slider mounting portion 19 of the mounting portion 17, the outrigger portions 16, and the connecting portions 18 are exposed from the gimbal opening portion 46.

The gimbal portion insulating layer 41 includes a plurality (four pieces) of pedestals 47 at the inside of the gimbal opening portion 46.

The pedestals 47 are, in plane view, disposed in squares at the outer side with respect to the adhesive region 24 in the slider mounting portion 19. The pedestals 47 are formed into generally rectangular shapes in plane view.

The base insulating layer 9 is, for example, formed of an insulating material such as a synthetic resin including polyimide resin, polyamide imide resin, acrylic resin, polyether nitrile resin, polyether sulfone resin, polyethylene terephthalate resin, polyethylene naphthalate resin, and polyvinyl chloride resin. Preferably, the base insulating layer 9 is formed of polyimide resin.

The base insulating layer 9 has a thickness (maximum thickness) of, for example, 1 μm or more, or preferably 3 μm or more, and, for example, 35 μm or less, or preferably 33 μm or less.

The communicating hole 44 has a diameter (that is, diameter of an electrically conductive connecting portion 36) of, for example, 5 μm or more, or preferably 10 μm or more, and, for example, 100 μm or less, or preferably 90 μm or less.

As referred to FIGS. 1 and 2, the conductive pattern 10 is formed on the upper surface of the base insulating layer 9. To be specific, the conductive pattern 10 includes a magnetic head connecting circuit 37 as one example of a first conductive circuit, an electronic component connecting circuit 38 as one example of a second conductive circuit, and the electrically conductive connecting portion 36 as one example of a connecting portion.

The magnetic head connecting circuit 37 includes signal terminals 31A, head-side terminals 32 as one example of a magnetic head connecting terminal, and signal wires 35A.

A plurality (six pieces) of signal terminals 31A are provided at the rear end portion and the generally central portion in the widthwise direction of the main body portion insulating layer 40 and are disposed at spaced intervals to each other in the widthwise direction. The signal terminals 31A, as external terminals, are electrically connected to a read/write board (not shown).

As shown in FIGS. 2 and 3, a plurality (six pieces) of head-side terminals 32 are formed at the center in the widthwise direction in the rear-side portion of the gimbal front end insulating layer 43 so as to be overlapped with the rear end portion of the terminal forming region 23, when projected in the thickness direction, and are disposed at spaced intervals to each other in the widthwise direction.

A plurality (six pieces) of signal wires 35A are formed at spaced intervals to each other in the widthwise direction in the main body portion insulating layer 40 and are electrically connected to the signal terminals 31A and the head-side terminals 32. The signal wires 35A transmit electrical signals between the magnetic head 3 (ref: the phantom lines in FIG. 4) and the read/write board (not shown).

To be specific, the signal wires 35A are formed in the following manner. The signal wires 35A extend from the signal terminals 31A forwardly in the main body portion insulating layer 40 and bend in a branching state into two bundles along the main body portion insulating layer 40 toward both sides in the widthwise direction in the front end portion of the main body portion insulating layer 40. Thereafter, they bend forwardly at both end portions in the widthwise direction and extend forwardly along the gimbal outer-side insulating layers 42 toward the front end portion of the gimbal portion insulating layer 41. Then, as shown in FIG. 2, they bend inwardly in the widthwise direction in a converged state and then, are folded back to reach the head-side terminals 32, as shown in FIGS. 2 and 3, at the same position as the terminal forming region 23 of the front-side opening portion 21 in the front-rear direction.

The electronic component connecting circuit 38 includes power source terminals 31B, conductor-side connecting terminals 33, and power source wires 35B.

A plurality (two pieces) of power source terminals 31B are provided at the rear end portion of the main body portion insulating layer 40. One piece of power source terminal 31B is disposed at each of both outer sides in the widthwise direction of the plurality (six pieces) of signal terminals 31A at spaced intervals to the other piece thereof. The power source terminals 31B, as external terminals, are electrically connected to a power source (not shown).

A plurality (two pieces) of conductor-side connecting terminals 33 are formed at the center in the widthwise direction in the generally center in the front-rear direction of the gimbal front end insulating layer 43 so as to be overlapped with the front end portion of the terminal forming region 23, when projected in the thickness direction, and are disposed at spaced intervals to each other in the widthwise direction. The conductor-side connecting terminals 33 are formed into generally circular shapes (round land shapes) in plane view and are, when projected in the thickness direction, disposed so as to include the electrically conductive connecting portion 36. As shown in FIG. 5, the lower end portions thereof are continuous to the upper end portion of the electrically conductive connecting portion 36 (described later). To be specific, in this manner, the power source terminals 31B are electrically connected to the metal supporting terminals 26 via the power source wires 35B, the conductor-side connecting terminals 33, the electrically conductive connecting portion 36, the metal-side connecting terminals 27, and the metal wires 28.

A plurality (two pieces) of power source wires 35B are provided in the main body portion insulating layer 40. One piece of power source wire 35B is formed at each of both outer sides in the widthwise direction of the plurality (six pieces) of signal wires 35A at spaced intervals to the other piece thereof in the widthwise direction. The power source wires 35B are electrically connected to the power source terminals 31B and the conductor-side connecting terminals 33. The power source wires 35B transmit electrical signals between the light emitting element 5 (ref: the phantom lines in FIG. 5) and the power source (not shown).

To be specific, the power source wires 35B are formed so as to extend from the power source terminals 31B forwardly along the signal wires 35A and as shown in FIG. 2, bend inwardly in the widthwise direction to reach the conductor-side connecting terminals 33, as shown in FIGS. 2 and 3, at the same position as the terminal forming region 23 of the front-side opening portion 21 in the front-rear direction.

The electrically conductive connecting portion 36 is provided in the communicating holes 44. To be specific, the electrically conductive connecting portion 36 is provided so as to fill the communicating holes 44. The electrically conductive connecting portion 36 is formed into a columnar shape that has a smaller diameter than that of the conductor-side connecting terminal 33.

The electrically conductive connecting portion 36 is, when projected in the thickness direction, formed so as to be included in the metal-side connecting terminals 27. As shown in FIG. 5, the upper end portion thereof is continuous to the lower surfaces of the conductor-side connecting terminals 33, and the lower end portion thereof is in contact with the upper surfaces of the metal-side connecting terminals 27.

The conductive pattern 10 is, for example, formed of a conductive material such as copper, nickel, gold, and solder or an alloy thereof. Preferably, the conductive pattern 10 is formed of copper.

The conductive pattern 10 has a thickness of, for example, 1 µm or more, or preferably 3 µm or more, and, for example, 50 µm or less, or preferably 20 µm or less.

The signal wire 35A and the power source wire 35B have a width of, for example, 5 µm or more, or preferably 8 µm or more, and, for example, 200 µm or less, or preferably 100 µm or less.

A gap between the plurality of signal wires 35A, and a gap between the signal wire 35A and the power source wire 35B are, for example, 5 µm or more, or preferably 8 µm or more, and, for example, 1000 µm or less, or preferably 100 µm or less.

The signal terminal 31A, the power source terminal 31B, the head-side terminal 32, and the conductor-side connecting terminal 33 have a width and a length (length in the front-rear direction) of, for example, 10 µm or more, or preferably 20 µm or more, and, for example, 1000 µm or less, or preferably 800 µm or less.

A gap between the plurality of signal terminals 31A, a gap between the signal terminal 31A and the power source terminal 31B, and a gap between the plurality of head-side terminals 32 are, for example, 10 µm or more, or preferably 20 µm or more, and, for example, 1000 µm or less, or preferably 800 µm or less.

The conductor-side connecting terminal 33 has a diameter of, for example, 30 µm or more, or preferably 40 µm or more, and, for example, 200 µm or less, or preferably 150 µm or less.

The electrically conductive connecting portion 36 has a diameter of, for example, 5 µm or more, or preferably 10 µm or more, and, for example, 100 µm or less, or preferably 90 µm or less.

Although not shown, on the surfaces of the signal terminals 31A, the power source terminals 31B, the head-side terminals 32, and the conductor-side connecting terminals 33, plating layers are formed, for example, by plating such as electroless plating or electrolytic plating, or preferably by electrolytic plating. The plating layers are, for example, formed of a metal material such as nickel and gold. Preferably, the plating layers are formed of gold. The plating layer has a thickness of, for example, 0.01 µm or more, or preferably 0.05 µm or more, and, for example, 8 µm or less, or preferably 4 µm or less.

As referred to FIGS. 1 and 2, the cover insulating layer 11 is formed over the main body portion 13 and the gimbal portion 14. As shown in FIG. 5, the cover insulating layer 11 is formed on the upper surface of the base insulating layer 9 in an outer shape pattern that is the generally same as that of the base insulating layer 9 so as to cover the conductive pattern 10.

The cover insulating layer 11 covers the signal wires 35A and the power source wires 35B and exposes the upper surfaces of the signal terminals 31A, the power source terminals 31B, the head-side terminals 32, and the conductor-side connecting terminals 33.

To be specific, in the cover insulating layer 11, signal terminal opening portions (not shown) that expose the upper surfaces of the signal terminals 31A, power source terminal opening portions (not shown) that expose the upper surfaces of the power source terminals 31B, and as one example of a second opening portion, connecting terminal opening portions 39 that expose the upper surfaces of the conductor-side connecting terminals 33 are formed. In the terminal mounting portion 20, the rear end edge of the cover insulating layer 11 is formed so as to expose the head-side terminals 32. That is, the rear end edge of the cover insulating layer 11 in the terminal mounting portion 20 is, in plane view, positioned at the front side with respect to the rear end edge of the gimbal front end insulating layer 43 of the base insulating layer 9.

The connecting terminal opening portions 39 pass through the cover insulating layer 11 in the thickness direction and are, when projected in the thickness direction, formed so as to be overlapped with the electrically conductive connecting portion 36. The connecting terminal opening portions 39 are, when projected in the thickness direction, formed so as to be included in the conductor-side connecting terminals 33. That is, the connecting terminal opening portions 39 are formed so as to expose the inner circumferential portions of the upper surfaces of the conductor-side connecting terminals 33.

The cover insulating layer 11 is formed of the same insulating material as that forming the base insulating layer 9. The cover insulating layer 11 has a thickness of, for example, 1 µm or more, or preferably 3 µm or more, and, for example, 40 µm or less, or preferably 10 µm or less.

The connecting terminal opening portion 39 has a diameter of, for example, 10 µm or more, or preferably 20 µm or more, and, for example, 100 µm or less, or preferably 80 µm or less.

Next, a method for producing the suspension board with circuit 1 is described with reference to FIGS. 6A to 6E.

In this method, as shown in FIG. 6A, first, the metal supporting board 8 is prepared.

Next, as shown in FIG. 6B, the base insulating layer 9 is formed on the upper surface of the metal supporting board 8.

To be specific, as referred to FIG. 1, the base insulating layer 9 is formed on the metal supporting board 8 as a pattern corresponding to the main body portion insulating layer 40 and the gimbal portion insulating layer 41. In the gimbal portion insulating layer 41, the base insulating layer 9 is formed as a pattern including the communicating holes 44 and the gimbal opening portion 46.

To form the base insulating layer 9 in which the communicating holes 44 and the gimbal opening portion 46 are formed, a varnish of an insulating material having photosensitivity is applied onto the metal supporting board 8 to be then dried, thereby forming a base film.

Thereafter, the base film is exposed to light via a photomask that is not shown. The photomask includes a light shielding portion and a light fully transmitting portion. The light fully transmitting portion to a portion in which the base insulating layer 9 is formed and the light shielding portion to a portion in which the base insulating layer 9 is not formed and portions in which the communicating holes 44 and the gimbal opening portion 46 are formed are disposed in opposed relation to the base film to be then exposed to light.

Thereafter, the base film is developed and is, if necessary, cured by heating, so that the base insulating layer 9 including the communicating holes 44 and the gimbal opening portion 46 is formed in the above-described pattern.

Next, as shown in FIG. 6C, the conductive pattern 10 is formed on the upper surface of the base insulating layer 9 by a pattern forming method such as an additive method or a subtractive method, or preferably by an additive method.

That is, as referred to FIG. 1, the conductive pattern 10 is formed on the upper surface of the base insulating layer 9 so as to include the signal terminals 31A, the power source terminals 31B, the head-side terminals 32, the conductor-side connecting terminals 33, the signal wires 35A, the power source wires 35B, and the electrically conductive connecting portion 36. As to the conductor-side connecting terminals 33, first, the electrically conductive connecting portion 36 fills the communicating holes 44 and next, the conductor-side connecting terminals 33 are formed thereon. In this manner, the electrically conductive connecting portion 36 and the conductor-side connecting terminals 33 are integrally formed.

Next, as shown in FIG. 6D, the cover insulating layer 11 is formed on the upper surface of the base insulating layer 9 so as to cover the conductive pattern 10.

To be specific, as referred to FIG. 5, the cover insulating layer 11 is formed over the metal supporting board 8 as a pattern covering the signal wires 35A and the power source wires 35B and exposing the upper surfaces of the signal terminals 31A, the power source terminals 31B, the head-side terminals 32, and the conductor-side connecting terminals 33. That is, the cover insulating layer 11 is formed as a pattern in which the signal terminal opening portions, the power source terminal opening portions, and the connecting terminal opening portions 39 are included and the rear end edge thereof in the terminal mounting portion 20 is at the front side with respect to the rear end edge of the base insulating layer 9.

To form the cover insulating layer 11, a varnish of an insulating material having photosensitivity is applied to be then dried, thereby forming a cover film, and thereafter, the obtained cover film is exposed to light to be subsequently developed to be cured by heating, thereby forming the cover insulating layer 11 in the above-described pattern in the same manner as the formation of the base insulating layer 9.

Next, as shown in FIG. 6E, the metal supporting board 8 is trimmed so as to form the rear-side opening portion 15 and the front-side opening portion 21 and to form the metal supporting terminals 26, the metal-side connecting terminals 27, and the metal wires 28 at the inside of the front-side opening portion 21 by, for example, etching or the like.

In this manner, the suspension board with circuit 1 is produced.

Thereafter, in the obtained suspension board with circuit 1, as shown by the phantom lines in FIG. 6E, the front ends (lower ends) of one pair of test probes 60 are pressed against each of the terminals and then, the electrical conduction of the conductive pattern 10 is tested.

To be specific, when the electrical conduction of the magnetic head connecting circuit 37 is tested, one test probe 60 is pressed against the heat-side terminal 32 and the other test probe 60 is pressed against the signal terminal 31A from one side in the thickness direction of the suspension board with circuit 1. In this manner, the presence or absence of disconnection of the signal wire 35A can be tested.

When the electrical conduction of the electronic component connecting circuit 38 is tested, the one test probe 60 is pressed against the conductor-side connecting terminal 33 and the other test probe 60 is pressed against the power source terminal 31B from the one side in the thickness direction of the suspension board with circuit 1. In this manner, the presence or absence of disconnection of the power source wire 35B can be tested.

As shown by the phantom lines in FIGS. 2 to 4, the slider unit 6 is mounted on the suspension board with circuit 1.

As shown in FIG. 5, the slider unit 6 includes the slider 4 and the light emitting element 5.

The slider 4 is formed into a generally rectangular box shape in plane view. The slider 4 is mounted with the magnetic head 3.

The magnetic head 3 is formed at the upper-side portion of the front end portion of the slider 4 and is provided so as to be capable of reading and writing on a magnetic disk that is not shown.

The light emitting element 5 is formed into a generally rectangular shape in plane view having a smaller outer shape than that of the slider 4. The light emitting element 5 is, for example, a heat assist device including a laser diode and is provided so that a recording surface of the magnetic disk that is not shown can be heated by laser beam. The light emitting element 5 is provided on the lower surface of the front end portion of the slider 4.

The slider unit 6 is mounted on the suspension board with circuit 1 from the upper side thereof so that the light emitting element 5 is inserted into the light emitting element insertion region 22.

Then, the squares on the lower surface of the slider 4 are brought into contact with the upper surfaces of the pedestals 47 and are bonded thereto via the known adhesive 50 applied to the connecting region 24, so that the slider 4 is disposed on the slider mounting portion 19 of the gimbal portion 14.

In the slider unit 6, a terminal 48 of the slider 4 is electrically connected to the head-side terminal 32 by a solder ball 45, and a terminal 49 of the light emitting element 5 is electrically connected to the metal supporting terminal 26 by the solder ball 45 with respect to the suspension board with circuit 1.

According to the suspension board with circuit 1, as shown in FIG. 5, the magnetic head 3 provided in the slider 4 is electrically connected to the head-side terminal 32 from the upper side of the suspension board with circuit 1, and the light emitting element 5 is electrically connected to the metal supporting terminal 26 from the lower side thereof.

As shown in FIG. 5, in the suspension board with circuit 1, the head-side terminal 32 is exposed upwardly. The conductor-side connecting terminal 33 is exposed from the cover insulating layer 11 upwardly at the inside of the connecting terminal opening portion 39. That is, in the suspension board with circuit 1, the head-side terminal 32 and the conductor-side connecting terminal 33 are exposed from the same side thereof.

As a result, by pressing the test probes 60 against the head-side terminal 32 and the conductor-side connecting terminal 33 from the upper side, the electrical conduction test of each of the head-side terminal 32 and the metal supporting terminal 26 can be performed. Accordingly, improvement in workability of the electrical conduction test can be achieved.

The metal supporting board 8 includes the metal supporting terminal 26, so that a further conductive layer for providing the metal supporting terminal 26 and an insulating layer for insulating the conductive layer in the thickness direction are not required to be provided. Accordingly, the thinning and light weight of the suspension board with circuit 1 can be achieved.

According to the suspension board with circuit 1, when projected in the thickness direction, the connecting terminal opening portion 39 is overlapped with the electrically conductive connecting portion 36.

Thus, the electrical conduction test can be performed in the electrically conductive connecting portion 36 that is electrically connected to the metal supporting board 8, so that the electrical conduction test with higher accuracy can be performed.

Second Embodiment

Figure 7:
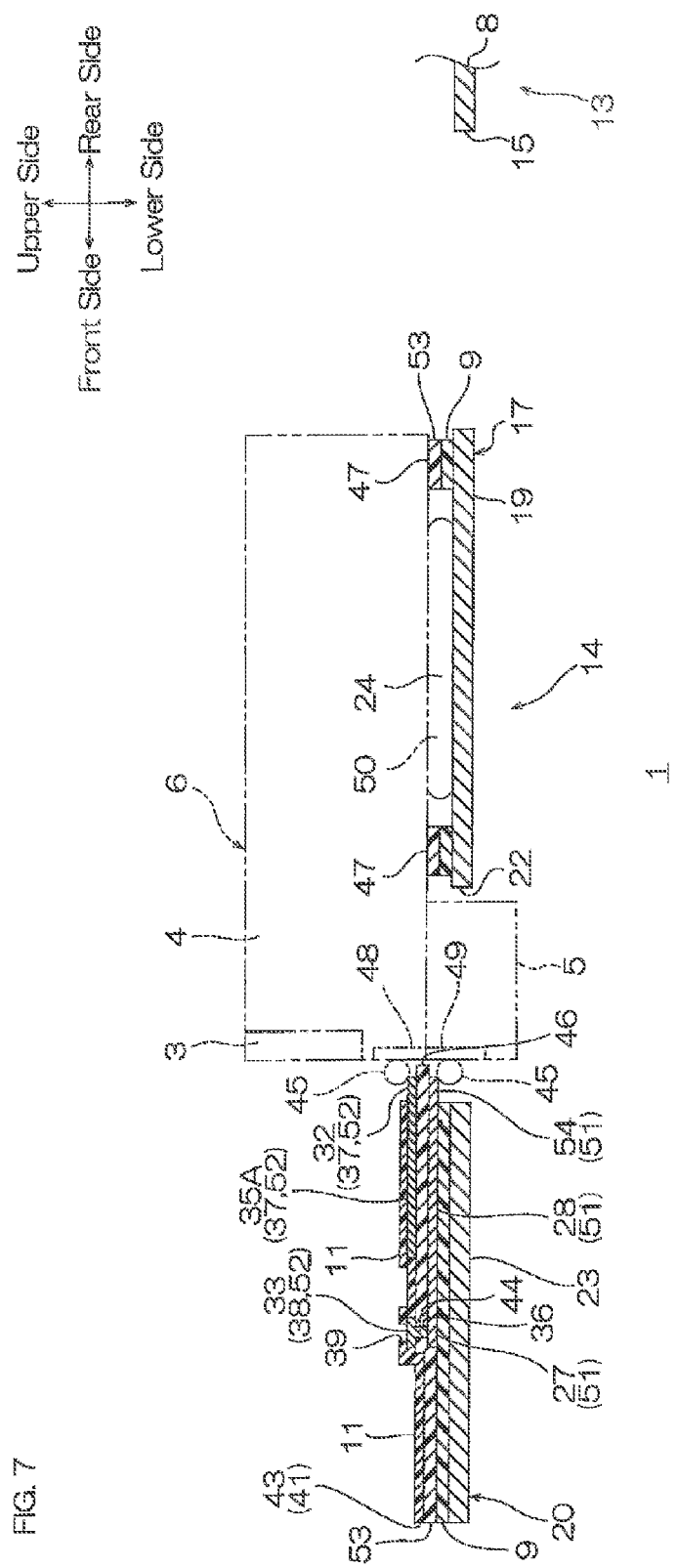
FIG. 7 shows a sectional view of a gimbal portion in a second embodiment of a suspension board with circuit of the present invention.

The suspension board with circuit 1 of the second embodiment is described with reference to FIG. 7. In the second embodiment, the same reference numerals are provided for members corresponding to each of those described in the above-described first embodiment, and their detailed description is omitted.

In the above-described first embodiment, as referred to FIG. 5, the metal supporting board 8, the base insulating layer 9, the conductive pattern 10, and the cover insulating layer 11 are included. In the second embodiment, as shown in FIG. 7, the metal supporting board 8, the base insulating layer 9, a first conductive pattern 51 as one example of the first layer, an intermediate insulating layer 53 as one example of the second layer, a second conductive pattern 52 as one example of the third layer, and the cover insulating layer 11 as one example of the fourth layer are included.

The metal supporting board 8 is formed at the lowermost side of the suspension board with circuit 1. That is, the metal supporting board 8 is formed on the lower side of the base insulating layer 9. In the metal supporting board 8, the front-side opening portion 21 in the first embodiment is not formed. The metal supporting board 8 does not include the metal supporting terminal 26, the metal-side connecting terminal 27, and the metal wire 28.

The base insulating layer 9 is formed on the upper side of the metal supporting board 8. That is, the base insulating layer 9 is formed on the lower side of the first conductive pattern 51.

The base insulating layer 9 is formed so as to correspond to a pattern in which the first conductive pattern 51 is formed. The communicating hole 44 is not formed in the base insulating layer 9.

The first conductive pattern 51 is formed on the upper side of the base insulating layer 9. The first conductive pattern 51 includes a conductive pattern terminal 54 as one example of the electronic component connecting terminal, the metal-side connecting terminal 27, and the metal wire 28 at the inside of the terminal forming region 23.

The conductive pattern terminal 54 is formed as the generally same pattern as that of the metal supporting terminal 26.

The intermediate insulating layer 53 is formed on the upper side of the base insulating layer 9 so as to cover the first conductive pattern 51.

The communicating hole 44 is formed in the intermediate insulating layer 53. The communicating hole 44 is, when projected in the thickness direction, formed into a generally circular shape in plane view so as to pass through the intermediate insulating layer 53 in the thickness direction in a portion overlapped with the metal-side connecting terminal 27.

The second conductive pattern 52 is formed on the upper side of the intermediate insulating layer 53 and includes the magnetic head connecting circuit 37, the electronic component connecting circuit 38, and the electrically conductive connecting portion 36.

The electrically conductive connecting portion 36 is provided so as to fill the communicating hole 44.

The cover insulating layer 11 is formed on the upper side of the intermediate insulating layer 53 in the generally same outer shape pattern as that of the base insulating layer 9 so as to cover the second conductive pattern 52.

In the suspension board with circuit 1 of the second embodiment, the same function and effect as that of the above-described first embodiment can be achieved.

Particularly, according to the suspension board with circuit 1 of the second embodiment, the first conductive pattern 51, the intermediate insulating layer 53 formed on the upper side of the first conductive pattern 51, the second conductive pattern 52 formed on the upper side of the intermediate insulating layer 53, and the cover insulating layer 11 formed on the upper side of the second conductive pattern 52 are included and furthermore, the base insulating layer 9 formed on the lower side of the first conductive pattern 51 and the metal supporting board 8 formed on the lower side of the base insulating layer 9 are included.

Thus, the metal supporting board 8 supports the first conductive pattern 51 including the conductive pattern terminal 54, so that improvement in mechanical strength of the conductive pattern terminal 54 can be achieved.

Third Embodiment

Figure 8:
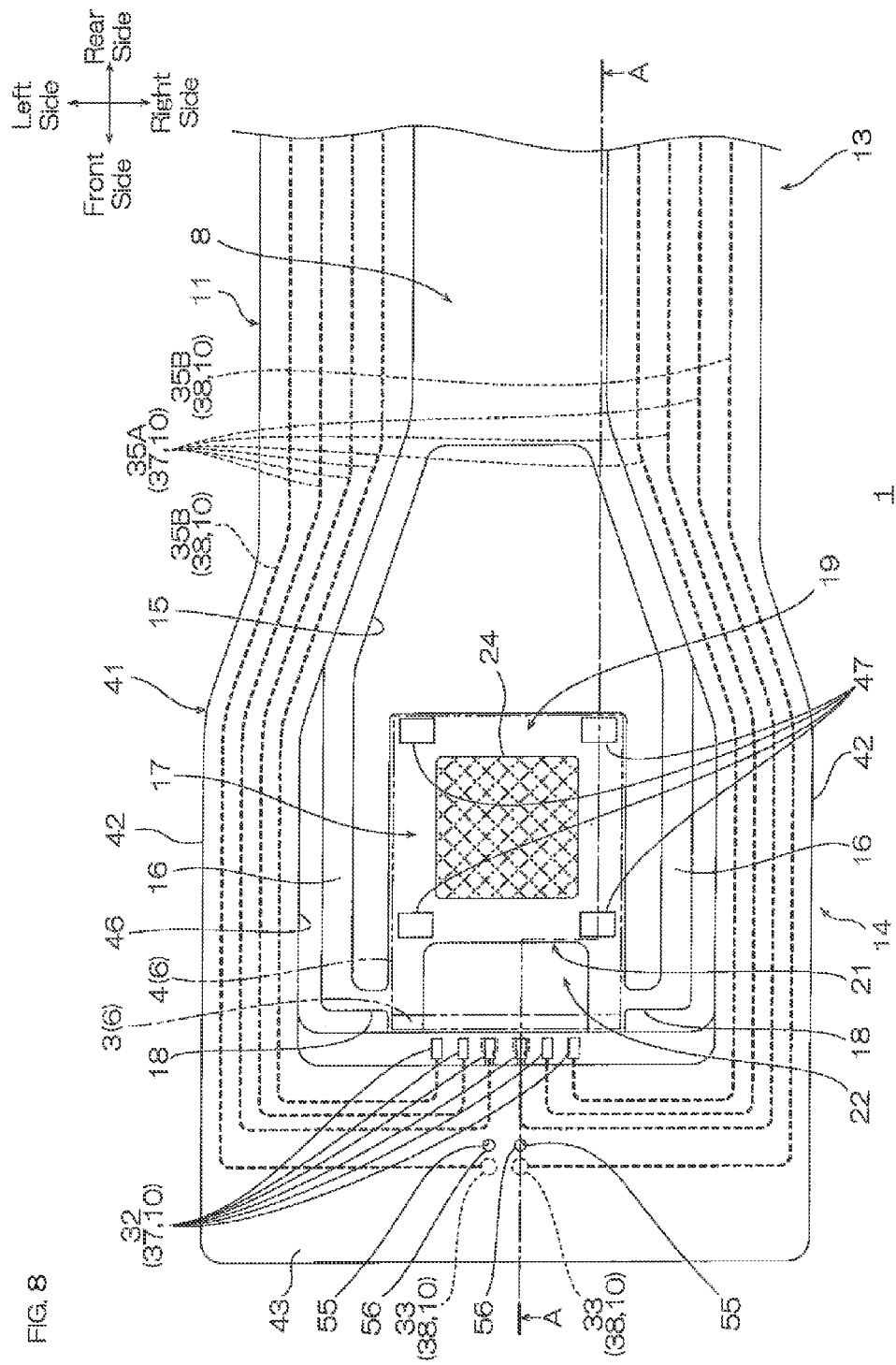
FIG. 8 shows a plan view (illustrating a cover insulating layer) of a gimbal portion in a third embodiment of a suspension board with circuit of the present invention.

The suspension board with circuit 1 of the third embodiment is described with reference to FIGS. 8 and 9. In the third embodiment, the same reference numerals are provided for members corresponding to each of those described in the above-described first embodiment, and their detailed description is omitted.

In the above-described first embodiment, as referred to FIGS. 4 and 5, the connecting terminal opening portions 39 as one example of the second opening portion are, when projected in the thickness direction, formed so as to be included in the conductor-side connecting terminals 33. Alternatively, for example, as shown in FIGS. 8 and 9, metal wire opening portions 55 as one example of the second opening portion can be also, when projected in the thickness direction, formed so as to be overlapped with the metal wires 28.

The metal wire opening portions 55 pass through the cover insulating layer 11 and the base insulating layer 9 in the thickness direction and expose the upper surfaces (metal wire exposing portions 56) of the metal wires 28. The metal wire opening portions 55 are, when projected in the thickness direction, formed into generally circular shapes in plane view so as to be included in the metal wires 28. That is, the metal wire opening portions 55 are formed so as to expose the inner-side portions of the upper surfaces of the metal wires 28.

The diameter of the metal wire opening portion 55 (that is, the diameter of the metal wire exposing portion 56) is shorter than the width of the metal wire 28 and is, for example, 10 µm or more, or preferably 20 µm or more, and, for example, 200 µm or less, or preferably 150 µm or less.

Figure 9:
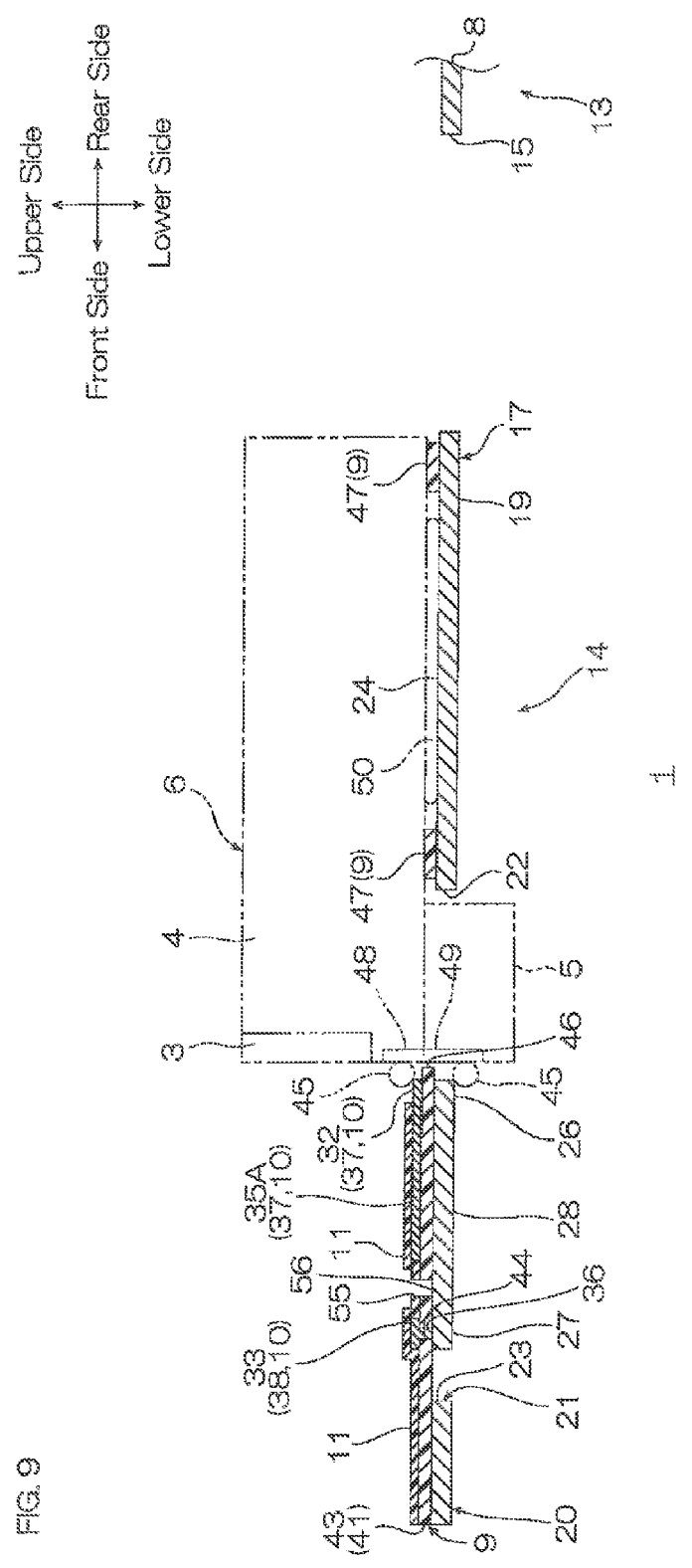

As shown in FIG. 9, in the suspension board with circuit 1, the head-side terminals 32 are exposed upwardly. The metal wires 28 are exposed from the cover insulating layer 11 and the base insulating layer 9 upwardly at the inside of the metal wire opening portion 55. That is, in the suspension board with circuit 1, the head-side terminals 32 and the metal wires 28 are exposed from the same side thereof.

As a result, by pressing the test probes 60 against the head-side terminal 32 and the metal wire 28 (metal wire exposing portion 56) from the upper side, the electrical conduction test of each of the head-side terminal 32 and the metal supporting terminal 26 can be performed. Accordingly, improvement in workability of the electrical conduction test can be achieved.

Particularly, according to the third embodiment, by pressing the test probe 60 against the metal wire exposing portion 56, in addition to the electrical conduction of the power source terminal 31B, the power source wire 35B, and the conductor-side connecting terminal 33, the electrical conduction on the contact surface of the electrically conductive connecting portion 36 with the metal-side connecting terminal 27 can be tested.

Meanwhile, according to the first embodiment, only the cover insulating layer 11 may be passed through and the area in plane view of the conductor-side connecting terminal 33 is large, so that the formation of the connecting terminal opening portion 39 is easy. When the test probe 60 is pressed, the mechanical strength of the connecting terminal opening portion 39 is excellent.

Fourth Embodiment

Figure 10:
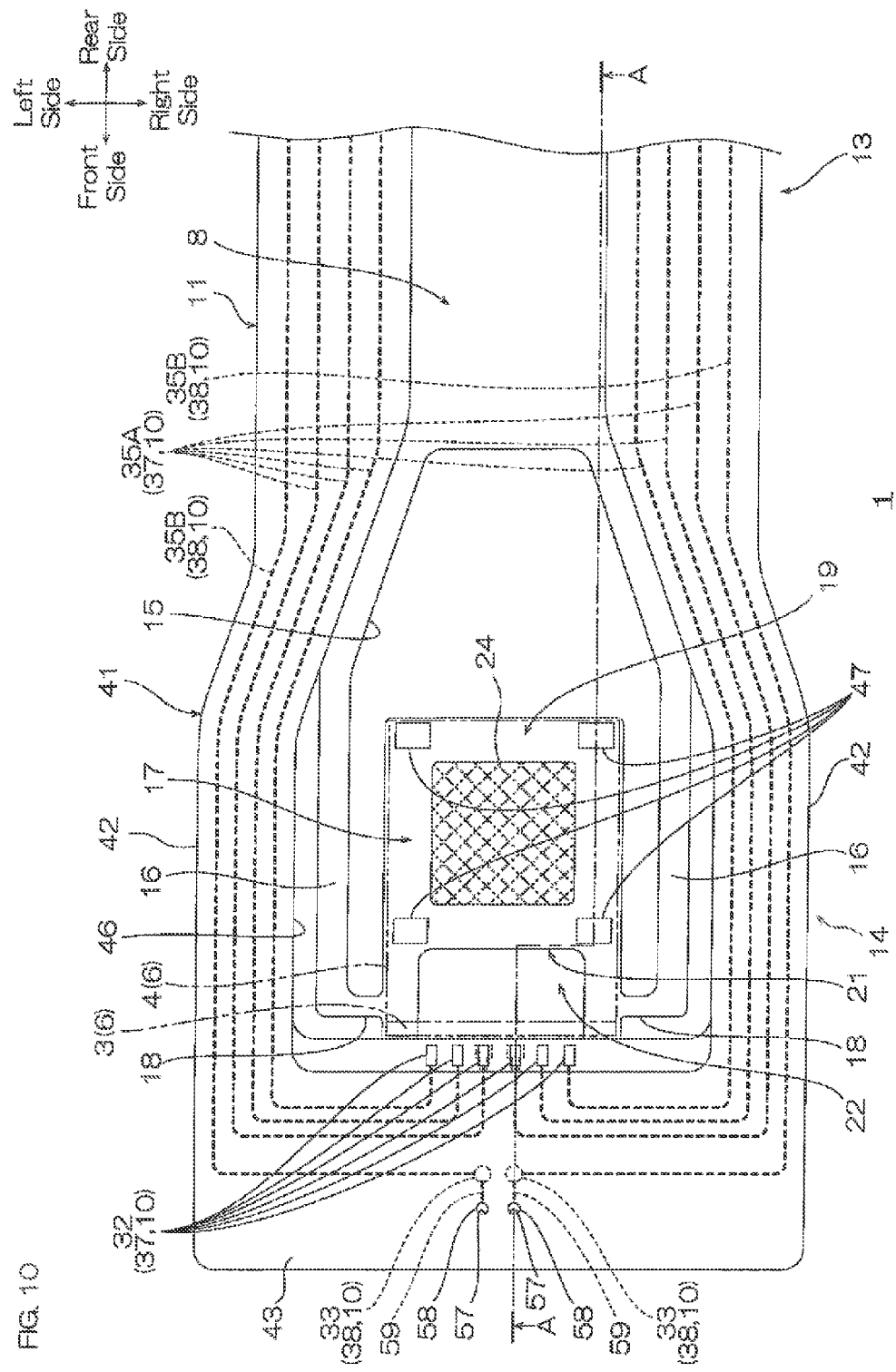
FIG. 10 shows a plan view (illustrating a cover insulating layer) of a gimbal portion in a fourth embodiment of a suspension board with circuit of the present invention.
Figure 11:
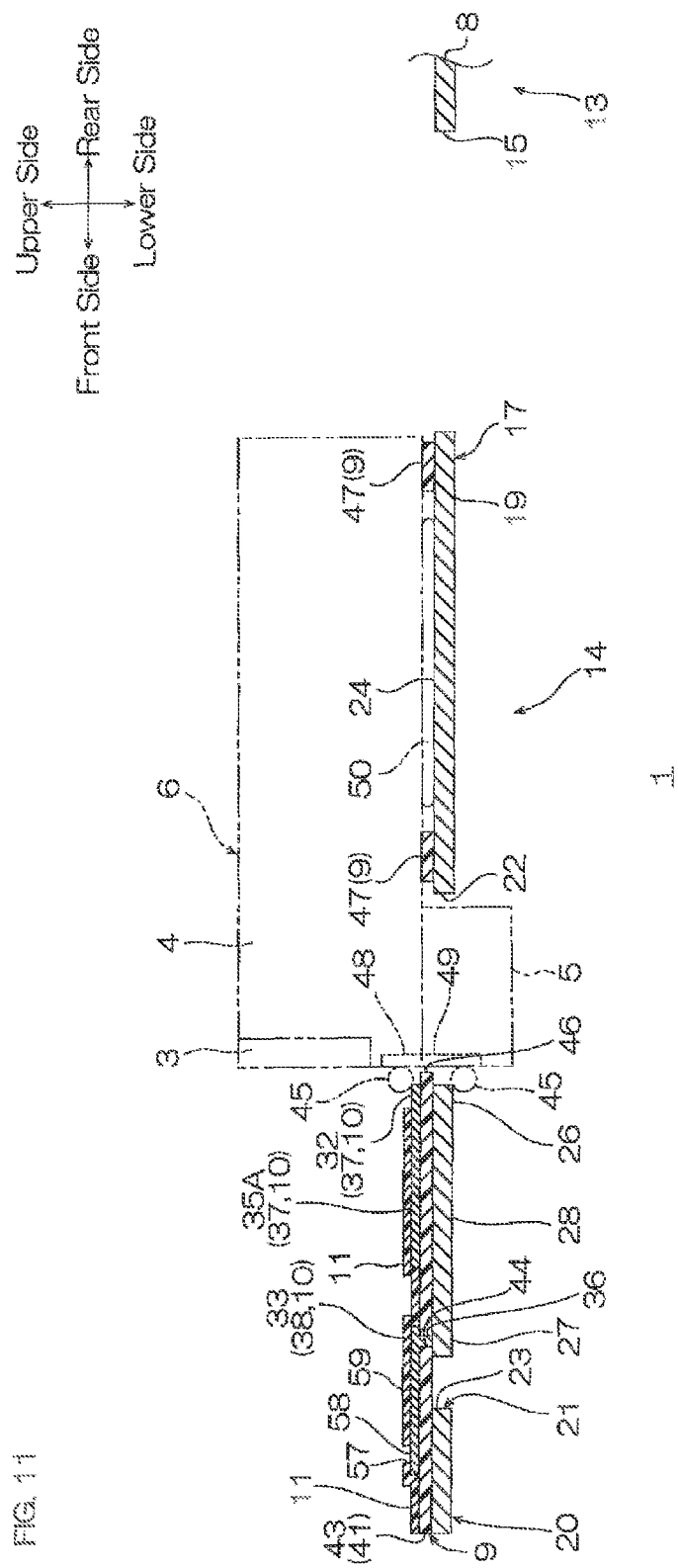
FIG. 11 shows a sectional view along an A-A line of the gimbal portion shown in FIG. 10.

The suspension board with circuit 1 of the fourth embodiment is described with reference to FIGS. 10 and 11. In the fourth embodiment, the same reference numerals are provided for members corresponding to each of those described in the above-described first embodiment, and their detailed description is omitted.

In the above-described first embodiment, as referred to FIGS. 4 and 5, the connecting terminal opening portions 39 as one example of the second opening portion are, when projected in the thickness direction, formed so as to be included in the conductor-side connecting terminals 33. Alternatively, for example, as shown in FIGS. 10 and 11, probe terminal opening portions 57 as one example of the second opening portion can be also, when projected in the thickness direction, formed so as to be overlapped with probe terminals 58 (described later).

In the suspension board with circuit 1 of the fourth embodiment, the conductive pattern 10 further includes the probe terminals 58 and probe wires 59.

The probe terminals 58 are formed at the front sides with respect to the conductor-side connecting terminals 33.

The probe wires 59 are formed so that the front sides thereof are electrically connected to the probe terminals 58 and the rear sides thereof are electrically connected to the conductor-side connecting terminals 33.

The probe terminal opening portions 57 pass through the cover insulating layer 11 in the thickness direction and are, when projected in the thickness direction, formed so as to be overlapped with the probe terminals 58. The probe terminal opening portions 57 are, when projected in the thickness direction, formed into generally circular shapes in plane view so as to be included in the probe terminals 58. That is, the probe terminal opening portions 57 are formed so as to expose the inner-side portions of the upper surfaces of the probe terminals 58.

The diameter of the probe terminal opening portion 57 (that is, the diameter of the probe terminal 58) is the same as that of the connecting terminal opening portion 39.

In the suspension board with circuit 1 of the fourth embodiment, the same function and effect as that of the above-described first embodiment can be achieved.

Particularly, according to the fourth embodiment, a degree of freedom in arrangement of the probe terminal 58 is large, so that the position at pressing the test probe in the electrical conduction test can be freely set. Thus, easy workability of the electrical conduction test can be achieved.

Meanwhile, according to the first embodiment, there is no need for separately providing a wire and a terminal for the electrical conduction test, so that the wire design is easy.

Fifth Embodiment

The suspension board with circuit 1 of the fifth embodiment is described with reference to FIGS. 12, 13A, and 13B. In the fifth embodiment, the same reference numerals are provided for members corresponding to each of those described in the above-described first embodiment, and their detailed description is omitted.

In the above-described first embodiment, the upper surfaces of the signal terminals 31A and the power source terminals 31B are exposed from the cover insulating layer 11. Alternatively, for example, as shown in FIGS. 12, 13A, and 13B, the upper surfaces of the signal terminals 31A and the power source terminals 31B can be also covered with the cover insulating layer 11, and the lower surfaces of the signal terminals 31A and the power source terminals 31B can be exposed from the metal supporting board 8 and the base insulating layer 9.

That is, in the above-described first embodiment, the signal terminals 31A and the power source terminals 31B are upper surface terminals (front surface terminals) that are electrically connected to an external component on the upper surfaces thereof. Meanwhile, in the fifth embodiment, the signal terminals 31A and the power source terminals 31B as one example of an external component connecting terminal are lower surface terminals (rear surface terminals) that are electrically connected to a read/write board or a power source as one example of an external component on the lower surfaces thereof.

To be specific, in the fifth embodiment, as shown in FIGS. 12, 13A, and 13B, a main body opening portion 71 is formed at the generally central portion of the main body portion 13 in the metal supporting board 8.

The main body opening portion 71 passes through the metal supporting board 8 in the thickness direction and is, when projected in the thickness direction, formed into a generally rectangular shape in plane view so as to include the signal terminals 35A, the power source wires 35B, the signal terminals 31A, and the power source terminals 31B.

The metal supporting board 8 includes a main body frame portion 72 that constitutes the outer shape of the main body opening portion 71. The main body frame portion 72 is formed into a rectangular frame shape in which the outer shape thereof is the generally same as that of the base insulating layer 9 in the main body portion 13.

In the base insulating layer 9, a plurality (six pieces) of signal terminal-side base opening portions 63 that expose the lower surfaces of the signal terminals 31A and a plurality (two pieces) of power source terminal-side base opening portions 68 that expose the lower surfaces of the power source terminals 31B are formed.

Each of the plurality (six pieces) of signal terminal-side base opening portions 63 is formed into a generally rectangular shape in plane view passing through the base insulating layer 9 in the thickness direction and including the signal terminal 31A when projected in the thickness direction.

Each of the plurality (two pieces) of power source terminal-side base opening portions 68 is formed into a generally rectangular shape in plane view passing through the base insulating layer 9 in the thickness direction and including the power source terminal 31B when projected in the thickness direction.

The signal terminal-side base opening portion 63 and the main body opening portion 71 constitute a signal terminal-side lower-side opening portion 65 as one example of an other-side opening portion. The power source terminal-side base opening portion 68 and the main body opening portion 71 constitute a power source terminal-side lower-side opening portion 70 as one example of the other-side opening portion.

The conductive pattern 10 includes the magnetic head connecting circuits 37 as one example of a conductive circuit and the electronic component connecting circuits 38 as one example of the conductive circuit.

Each of the plurality (six pieces) of magnetic head connecting circuits 37 includes the above-described head-side terminal 32, the above-described signal wire 35A, the above-described signal terminal 31A, a signal terminal-side probe terminal 62, and a signal terminal-side probe wire 64.

The signal terminals 31A are formed so as to protrude toward the other side in the thickness direction with respect to the signal wires 35A and fill the inside of the signal terminal-side base opening portions 63. The signal terminals 31A are formed into square land shapes that are wider than the signal wires 35A. The lower surfaces of the signal terminals 31A are exposed from the base insulating layer 9 and the metal supporting board 8, that is, are exposed at the inside of the signal terminal-side lower-side opening portions 65 and are formed so as to be flush with the lower surface of the base insulating layer 9.

The signal terminal-side probe terminals 62 are formed into round land shapes that are wider than the signal terminal-side probe wires 64. The signal terminal-side probe terminals 62 are formed at the rear sides with respect to the signal terminals 31A and are, when projected in the thickness direction, formed at spaced intervals so as to be overlapped with the main body opening portion 71. The plurality (six pieces) of signal terminal-side probe terminals 62 are disposed at spaced intervals to each other in the widthwise direction.

The signal terminal-side probe wires 64 are formed so that the front sides thereof are electrically connected to the signal terminals 31A and the rear sides thereof are electrically connected to the signal terminal-side probe terminals 62.

Each of the plurality (two pieces) of electronic component connecting circuits 38 includes the above-described conductor-side connecting terminal 33, the above-described power source wire 35B, the above-described power source terminal 31B, a power source terminal-side probe wire 69, and a power source terminal-side probe terminal 67.

The power source terminals 31B are, in side sectional view, formed into the generally same shapes as those of the signal terminals 31A. That is, the power source terminals 31B are formed so as to protrude toward the other side in the thickness direction with respect to the power source wires 35B and fill the inside of the power source terminal-side base opening portions 68. The lower surfaces of the power source terminals 31B are exposed from the base insulating layer 9 and the metal supporting board 8, that is, are exposed in the power source terminal-side lower-side opening portion 70, and are formed so as to be flush with the lower surface of the base insulating layer 9.

The power source terminal-side probe terminals 67 are formed at spaced intervals to the rear sides of the power source terminals 31B and are, when projected in the thickness direction, formed so as to be overlapped with the main body opening portion 71. One piece of the plurality of power source terminal-side probe terminals 67 is disposed at each of both outer sides in the widthwise direction of the plurality (six pieces) of signal terminal-side probe terminals 62 at spaced intervals to the other piece thereof.

The power source terminal-side probe wires 69 are formed so that the front sides thereof are electrically connected to the power source terminals 31B and the rear sides thereof are electrically connected to the power source terminal-side probe terminals 67.

In the cover insulating layer 11, signal terminal-side probe opening portions 61 as one example of a one-side opening portion and power source terminal-side probe opening portions 66 as one example of the one-side opening portion are formed in the main body portion 13.

A plurality (six pieces) of signal terminal-side probe opening portions 61 are formed corresponding to the signal terminal-side probe terminals 62. The signal terminal-side probe opening portions 61 pass through the cover insulating layer 11 in the thickness direction and are, when projected in the thickness direction, disposed in a position not overlapped with the signal terminals 31A and in a position overlapped with the signal terminal-side probe terminals 62. The signal terminal-side probe opening portions 61 are, when projected in the thickness direction, formed into generally circular shapes in plane view so as to be included in the signal terminal-side probe terminals 62. That is, the signal terminal-side probe opening portions 61 are formed so as to expose the inner-side portions of the upper surfaces of the signal terminal-side probe terminals 62.

A plurality (two pieces) of power source terminal-side probe opening portions 66 are formed corresponding to the power source terminal-side probe terminals 67. The power source terminal-side probe opening portions 66 are, in side sectional view, formed into the same shapes as those of the signal terminal-side probe opening portions 61. The power source terminal-side probe opening portions 66 pass through the cover insulating layer 11 in the thickness direction and are, when projected in the thickness direction, disposed in a position not overlapped with the power source terminals 31B and in a position overlapped with the power source terminal-side probe terminals 67. The power source terminal-side probe opening portions 66 are, when projected in the thickness direction, formed into generally rectangular circular shapes in plane view so as to be included in the power source terminal-side probe terminals 67. That is, the power source terminal-side probe opening portions 66 are formed so as to expose the inner-side portions of the upper surfaces of the power source terminal-side probe terminals 67.

The diameter of the signal terminal-side probe opening portion 61 and that of the power source terminal-side probe opening portion 66 are the same as that of the connecting terminal opening portion 39.

In the suspension board with circuit 1 of the fifth embodiment, the same function and effect as that of the above-described first embodiment can be achieved.

Particularly, according to the fifth embodiment, when the signal terminal 31A and the power source terminal 31B are the lower surface terminals (rear surface terminals), the test probes can be pressed against the signal terminal-side probe terminal 62 and the power source terminal-side probe terminal 67 from the upper sides thereof. Thus, improvement in workability of the electrical conduction test can be achieved.

In the above-described fifth embodiment, both of the signal terminal 31A and the power source terminal 31B are the lower surface terminals. Alternatively, only either one of the signal terminal 31A or the power source terminal 31B can be also defined as the lower surface terminal In such a case, only the conductive pattern including the lower surface terminal can include the probe wire (the signal terminal-side probe wire 64 or the power source terminal-side probe wire 69).

Sixth Embodiment

The suspension board with circuit 1 of the sixth embodiment is described with reference to FIGS. 14, 15A, and 15B. In the sixth embodiment, the same reference numerals are provided for members corresponding to each of those described in the above-described fifth embodiment, and their detailed description is omitted.

In the above-described fifth embodiment, the signal terminal-side probe terminals 62 and the power source terminal-side probe terminals 67 are, when projected in the thickness direction, formed so as to be overlapped with the main body opening portion 71. Alternatively, for example, as shown in FIGS. 14, 15A, and 15B, the signal terminal-side probe terminals 62 and the power source terminal-side probe terminals 67 can be also, when projected in the thickness direction, formed so as to be overlapped with the main body frame portion 72 of the metal supporting board 8.

To be specific, the signal terminal-side probe opening portions 61, the signal terminal-side probe terminals 62, the power source terminal-side probe opening portions 66, and the power source terminal-side probe terminals 67 are disposed on the rear end portion of the main body frame portion 72.

In the suspension board with circuit 1 of the sixth embodiment, the same function and effect as that of the above-described fifth embodiment can be achieved.

Particularly, the signal terminal-side probe terminals 62 and the power source terminal-side probe terminals 67 are disposed on and supported by the main body frame portion 72, so that when the test probes are pressed against the signal terminal-side probe terminal 62 and the power source terminal-side probe terminal 67, mechanical strength is excellent.

Another Modified Example

In the above-described first embodiment, as referred to FIGS. 4 and 5, the connecting terminal opening portions 39 are, when projected in the thickness direction, formed so as to be included in the conductor-side connecting terminals 33. Alternatively, though not shown, the connecting terminal opening portions 39 can be also, when projected in the thickness direction, formed so as to be partially included in the conductor-side connecting terminals 33, that is, formed so as to be partially overlapped with the conductor-side connecting terminals 33.

Furthermore, the connecting terminal opening portions 39 can be also, when projected in the thickness direction, formed so as not to be overlapped with the conductor-side connecting terminals 33 but formed so as to be overlapped with the power source wires 35B. In such a case, the connecting terminal opening portions 39 can be formed in any one of the main body portion 13 and the gimbal portion 14 as long as it is a position overlapped with the power source wires 35B.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:
1. A suspension board with circuit comprising:
a first layer having electrically conductive properties, a second layer having insulation properties and formed at one side in a thickness direction of the first layer, a third layer having electrically conductive properties and formed at one side in the thickness direction of the second layer, and a fourth layer having insulation properties and formed at one side in the thickness direction of the third layer, wherein the first layer includes an electronic component connecting terminal which is electrically connected to an electronic component, the second layer includes a first opening portion passing through in the thickness direction, the third layer includes a first conductive circuit and a second conductive circuit, the first conductive circuit includes a magnetic head connecting terminal which is electrically connected to a magnetic head provided in a slider, such that the magnetic head connecting terminal is disposed on the one side in the thickness direction of the second layer having insulation properties, and the electronic component connecting terminal is disposed on an opposite side in the thickness direction of the second layer having insulation properties and is electrically connected to the electronic component on said opposite side, the first opening portion is provided with a connecting portion electrically connecting the second conductive circuit to the first layer, the fourth layer is formed with a second opening portion passing through in the thickness direction and exposing the second conductive circuit or the fourth layer and the second layer are formed with a second opening portion passing through in the thickness direction and exposing the first layer, and the second opening portion is hollow.

2. The suspension board with circuit according to claim 1, wherein at least a part of the second opening portion is, when projected in the thickness direction, overlapped with the connecting portion.

3. The suspension board with circuit according to claim 1, wherein the first layer is a metal supporting board, the second layer is a base insulating layer, the third layer is a conductive pattern, and the fourth layer is a cover insulating layer.

4. The suspension board with circuit according to claim 1 further including:

a base insulating layer formed at the other side in the thickness direction of the first layer and a metal supporting board formed at the other side in the thickness direction of the base insulating layer, wherein the first layer is a first conductive pattern, the second layer is an intermediate insulating layer, the third layer is a second conductive pattern, and the fourth layer is a cover insulating layer.

5. A suspension board with circuit comprising:

a main body portion and a gimbal portion that is formed at a front side of the main body portion;

a first layer having electrically conductive properties, a second layer having insulation properties and formed at one side in a thickness direction of the first layer, a third layer having electrically conductive properties and formed at one side in the thickness direction of the second layer, and a fourth layer having insulation properties and formed at one side in the thickness direction of the third layer, wherein the third layer includes a conductive circuit disposed at the main body portion;

the conductive circuit includes a connecting terminal disposed at the main body portion and for being electrically connected to an external component;

the first layer and the second layer are formed with an other-side opening portion passing through in the thickness direction and exposing the connecting terminal; and the fourth layer is formed with a one-side opening portion disposed at a position not being overlapped with the connecting terminal when projected in the thickness direction, passing through in the thickness direction, and exposing the conductive circuit in an opposite direction with respect to the exposed connecting terminal.

6. The suspension board with circuit according to claim 1, wherein the electronic component comprises a light emitting element.

7. The suspension board with circuit according to claim 1, wherein the first layer is a metal supporting board, the metal supporting board including at least one metal wire having one end portion electrically connected to the connecting portion and the other end portion electrically connected to the electronic component connecting terminal.

* * * * *